US012750032B2

(12) United States Patent
Cardona et al.

(10) Patent No.: US 12,750,032 B2
(45) Date of Patent: Sep. 29, 2026

(54) METAL-PIEZOELECTRIC-METAL CAPACITOR

(71) Applicant: Murata Manufacturing Co., Ltd., Nagaokakyo (JP)

(72) Inventors: Albert Cardona, Santa Barbara, CA (US); Drew Morosin, Oxnard, CA (US)

(73) Assignee: Murata Manufacturing Co., Ltd., Nagaokakyo (JP)

(*) Notice: Subject to any disclaimer, the term of this patent is extended or adjusted under 35 U.S.C. 154(b) by 97 days.

(21) Appl. No.: 18/781,233

(22) Filed: Jul. 23, 2024

(65) Prior Publication Data

US 2025/0038731 A1 Jan. 30, 2025

Related U.S. Application Data

(60) Provisional application No. 63/529,541, filed on Jul. 28, 2023.

(51) Int. Cl.

*H03H 9/02* (2006.01)
*H03H 9/17* (2006.01)
*H03H 9/56* (2006.01)

(52) U.S. Cl.

CPC .... *H03H 9/02228* (2013.01); *H03H 9/02015* (2013.01); *H03H 9/175* (2013.01); *H03H 9/568* (2013.01)

(58) Field of Classification Search

CPC ........... H03H 9/02228; H03H 9/02015; H03H 9/175; H03H 9/568

See application file for complete search history.

(56) References Cited

U.S. PATENT DOCUMENTS

| | | | |
|---|---|---|---|
| 5,705,399 | A | 1/1998 | Larue |
| 5,853,601 | A | 12/1998 | Krishaswamy et al. |
| 6,540,827 | B1 | 4/2003 | Levy et al. |
| 6,707,229 | B1 | 3/2004 | Martin |
| 7,135,940 | B2 | 11/2006 | Kawakubo et al. |

(Continued)

FOREIGN PATENT DOCUMENTS

| | | | |
|---|---|---|---|
| CN | 1926763 | A | 3/2007 |
| CN | 201893487 | U | 7/2011 |

(Continued)

OTHER PUBLICATIONS

T. Takai, H. Iwamoto, et al., "I.H.P. Saw Technology and its Application to Microacoustic Components (Invited)." 2017 IEEE International Ultrasonics Symposium, Sep. 6-9, 2017. pp. 1-8.

(Continued)

*Primary Examiner* — Samuel S Outten
(74) *Attorney, Agent, or Firm* — ArentFox Schiff LLP

(57) ABSTRACT

An acoustic resonator is provided that includes a substrate; a piezoelectric layer coupled to the substrate by one or more dielectric layers and having first and second surfaces that oppose each other; an interdigital transducer on at least one of the first and second surfaces of the piezoelectric layer and including interleaved fingers; and a capacitor electrically coupled in parallel to the interdigital transducer and including at least one first electrode on the first surface of the piezoelectric layer and a metal layer on the second surface of the piezoelectric layer, such that the piezoelectric layer is sandwiched between the at least one first electrode and the metal layer.

19 Claims, 28 Drawing Sheets

(56) References Cited

U.S. PATENT DOCUMENTS 7,463,118 B2 12/2008 Jacobsen
7,535,152 B2 5/2009 Ogami et al.
7,684,109 B2 3/2010 Godshalk et al.
7,802,466 B2 9/2010 Whalen et al.
7,868,519 B2 1/2011 Umeda
8,278,802 B1 10/2012 Lee et al.
8,344,815 B2 1/2013 Yamanaka
8,829,766 B2 9/2014 Milyutin et al.
8,932,686 B2 1/2015 Hayakawa et al.
9,130,145 B2 9/2015 Martin et al.
9,219,466 B2 12/2015 Meltaus et al.
9,276,557 B1 3/2016 Nordquist et al.
9,369,105 B1 6/2016 Li
9,425,765 B2 8/2016 Rinaldi
9,525,398 B1 12/2016 Olsson
9,748,923 B2 8/2017 Kando et al.
9,780,759 B2 10/2017 Kimura et al.
10,200,013 B2 2/2019 Bower et al.
10,305,447 B2 5/2019 Raihn et al.
10,491,192 B1 11/2019 Plesski et al.
10,601,392 B2 3/2020 Plesski et al.
10,637,438 B2 4/2020 Garcia et al.
10,756,697 B2 8/2020 Plesski et al.
10,790,802 B2 9/2020 Yantchev et al.
10,797,675 B2 10/2020 Plesski
10,826,462 B2 11/2020 Plesski et al.
10,868,513 B2 12/2020 Yantchev
2002/0079986 A1 6/2002 Ruby et al.
2002/0158714 A1 10/2002 Kaitila et al.
2003/0199105 A1 10/2003 Kub et al.
2004/0041496 A1 3/2004 Imai et al.
2004/0090145 A1 5/2004 Bauer et al.
2004/0207033 A1 10/2004 Koshido
2004/0207485 A1 10/2004 Kawachi et al.
2004/0261250 A1 12/2004 Kadota et al.
2005/0280476 A1 12/2005 Abe et al.
2006/0072875 A1 4/2006 Bhagavatula et al.
2006/0125489 A1 6/2006 Feucht et al.
2006/0131731 A1 6/2006 Sato
2006/0152107 A1 7/2006 Tanaka
2006/0222568 A1 10/2006 Wang et al.
2007/0001549 A1 1/2007 Kando et al.
2007/0090898 A1 4/2007 Kando
2007/0170565 A1 7/2007 Hong et al.
2007/0188047 A1 8/2007 Tanaka
2007/0194863 A1 8/2007 Shibata et al.
2010/0064492 A1 3/2010 Tanaka
2010/0102669 A1 4/2010 Yamanaka
2010/0107388 A1 5/2010 Iwamoto
2010/0123367 A1 5/2010 Tai et al.
2010/0212127 A1 8/2010 Heinze et al.
2010/0223999 A1 9/2010 Onoe
2010/0301703 A1 12/2010 Chen et al.
2011/0109196 A1 5/2011 Goto
2011/0199163 A1 8/2011 Yamanaka
2011/0278993 A1 11/2011 Iwamoto
2013/0015353 A1 1/2013 Tai et al.
2013/0021116 A1 1/2013 Sogoya et al.
2013/0057360 A1 3/2013 Meltaus et al.
2013/0321100 A1 12/2013 Wang
2014/0001919 A1 1/2014 Komatsu
2014/0009032 A1 1/2014 Takahashi et al.
2014/0113571 A1 4/2014 Fujiwara
2014/0145556 A1 5/2014 Kadota
2014/0151151 A1 6/2014 Reinhardt
2014/0152145 A1* 6/2014 Kando ............... H03H 9/02574
29/25.35
2014/0173862 A1 6/2014 Kando et al.
2014/0218129 A1 8/2014 Fujiwara
2014/0225684 A1 8/2014 Kando et al.
2014/0312994 A1 10/2014 Meltaus et al.
2015/0070227 A1 3/2015 Kishino et al.
2015/0319537 A1 11/2015 Perois et al.
2015/0333730 A1 11/2015 Meltaus
2016/0028367 A1 1/2016 Shealy
2016/0182009 A1 6/2016 Bhattacharjee
2016/0285430 A1 9/2016 Kikuchi et al.
2017/0005638 A1 1/2017 Otagawa et al.
2017/0063332 A1 3/2017 Gilbert et al.
2017/0077902 A1 3/2017 Daimon
2017/0104470 A1 4/2017 Koelle et al.
2017/0170808 A1 6/2017 Iwaki et al.
2017/0179928 A1 6/2017 Raihn et al.
2017/0187352 A1 6/2017 Omura
2017/0214387 A1 7/2017 Burak et al.
2017/0222618 A1 8/2017 Inoue et al.
2017/0222622 A1 8/2017 Solal et al.
2017/0264263 A1 9/2017 Huang et al.
2017/0324394 A1 11/2017 Ebner et al.
2017/0359050 A1 12/2017 Irieda et al.
2017/0370791 A1 12/2017 Nakamura et al.
2018/0062604 A1 3/2018 Koskela et al.
2018/0123016 A1 5/2018 Gong et al.
2018/0152169 A1 5/2018 Goto et al.
2018/0191322 A1 7/2018 Chang et al.
2019/0068164 A1 2/2019 Houlden et al.
2019/0123721 A1 4/2019 Takamine
2019/0131953 A1 5/2019 Gong
2019/0148621 A1 5/2019 Feldman et al.
2019/0181833 A1 6/2019 Nosaka
2019/0245518 A1 8/2019 Ito
2019/0273480 A1 9/2019 Lin
2019/0273481 A1 9/2019 Michigami
2019/0386635 A1 12/2019 Plesski et al.
2019/0386637 A1 12/2019 Plesski et al.
2019/0386638 A1 12/2019 Kimura et al.
2020/0007110 A1 1/2020 Konaka et al.
2020/0021271 A1 1/2020 Plesski et al.
2020/0091893 A1 3/2020 Plesski et al.
2020/0162052 A1 5/2020 Matsuoka et al.
2020/0212889 A1* 7/2020 Omura ............... H03H 9/02992
2020/0220522 A1 7/2020 Nosaka
2020/0228087 A1 7/2020 Michigami et al.
2020/0304091 A1 9/2020 Yantchev
2020/0328728 A1 10/2020 Nakagawa et al.
2020/0336130 A1 10/2020 Turner
2020/0373907 A1 11/2020 Garcia
2021/0006228 A1 1/2021 Garcia
2021/0013859 A1 1/2021 Turner et al.
2021/0013868 A1 1/2021 Plesski
2021/0126619 A1 4/2021 Wang et al.
2021/0273631 A1 9/2021 Jachowski et al.
2021/0384885 A1 12/2021 Daimon et al.
2022/0103160 A1 3/2022 Jachowski
2022/0216842 A1 7/2022 Nagatomo et al.
2022/0231661 A1 7/2022 McHugh
2022/0247382 A1* 8/2022 Dyer ...................... H03H 9/568

FOREIGN PATENT DOCUMENTS

CN 112352382 A 2/2021
DE 112011100580 T5 1/2013
JP H0522074 A 1/1993
JP H10209804 A 8/1998
JP 2001244785 A 9/2001
JP 2002300003 A 10/2002
JP 2003078389 A 3/2003
JP 2004096677 A 3/2004
JP 2004129222 A 4/2004
JP 2004304622 A 10/2004
JP 2006173557 A 6/2006
JP 2007251910 A 9/2007
JP 2010103803 A 5/2010
JP 2010109949 A 5/2010
JP 2010233210 A 10/2010
JP 2013528996 A 7/2013
JP 2015054986 A 3/2015
JP 2016001923 A 1/2016
JP 2017220910 A 12/2017
JP 2018166259 A 10/2018
JP 2018207144 A 12/2018
JP 2019186655 A 10/2019
JP 2020088459 A 6/2020
JP 2020113939 A 7/2020

(56) References Cited

FOREIGN PATENT DOCUMENTS

| | | | |
|---|---|---|---|
| WO | 2010047114 | A1 | 4/2010 |
| WO | 2013021948 | A1 | 2/2013 |
| WO | 2015098694 | A1 | 7/2015 |
| WO | 2015156232 | A1 | 10/2015 |
| WO | 2015182521 | A1 | 12/2015 |
| WO | 2016017104 | A1 | 2/2016 |
| WO | 2016052129 | A1 | 4/2016 |
| WO | 2016147687 | A1 | 9/2016 |
| WO | 2018003273 | A1 | 1/2018 |
| WO | 2018079522 | A1 | 5/2018 |
| WO | 2018163860 | A1 | 9/2018 |
| WO | 2019138810 | A1 | 7/2019 |
| WO | 2019241174 | A1 | 12/2019 |
| WO | 2020092414 | A2 | 5/2020 |
| WO | 2020175234 | A1 | 9/2020 |
| WO | 2021060523 | A1 | 4/2021 |
| WO | 2023002858 | A1 | 1/2023 |

OTHER PUBLICATIONS

R. Olsson III, K. Hattar et al. "A high electromechanical coupling coefficient SH0 Lamb wave lithiumniobate micromechanical resonator and a method for fabrication" Sensors and Actuators A: Physical, vol. 209, Mar. 1, 2014, pp. 183-190.
M. Kadota, S. Tanaka, "Wideband acoustic wave resonators composed of hetero acoustic layer structure," Japanese Journal of Applied Physics, vol. 57, No. 7S1. Published Jun. 5, 2018. 5 pages.
Y. Yang, R. Lu et al. "Towards Ka Band Acoustics: Lithium Niobat Asymmetrical Mode Piezoelectric MEMS Resonators", Department of Electrical and Computer Engineering University of Illinois at Urbana-Champaign, May 2018. pp. 1-2.
Y. Yang, A. Gao et al. "5 GHZ Lithium Niobate MEMS Resonators With High Fom of 153", 2017 IEEE 30th International Conference in Micro Electro Mechanical Systems (MEMS). Jan. 22-26, 2017. pp. 942-945.
USPTO/ISA, International Search Report and Written Opinion for PCT Application No. PCT/US2019/036433 dated Aug. 29, 2019.
USPTO/ISA, International Search Report and Written Opinion for PCT Application No. PCT/US2019/058632 dated Jan. 17, 2020.
G. Manohar, "Investigation of Various Surface Acoustic Wave Design Configurations for Improved Sensitivity." Doctoral dissertation, University of South Florida, USA, Jan. 2012, 7 pages.
Ekeom, D. & Dubus, Bertrand & Volatier, A. (2006). Solidly mounted resonator (SMR) FEM-BEM simulation. 1474-1477.10.1109/ULTSYM.2006.371.
Mizutaui, K. and Toda, K., "Analysis of lamb wave propagation characteristics in rotated Y-cut X-propagation LiNbO3 plates." Electron. Comm. Jpn. Pt. I, 69, No. 4 (1986): 47-55. doi:10.1002/ecja.4410690406.
Naumenko et al., "Optimal orientations of Lithium Niobate for resonator SAW filters", 2003 IEEE Ultrasonics Symposium—pp. 2110-2113. (Year: 2003).
Webster Dictionary "Meaning of diaphragm" Merriam Webster since 1828.
Safari et al. "Piezoelectric for Transducer Applications" published by Elsevier Science Ltd., pp. 4 (Year: 2000).
Moussa et al. Review on Triggered Liposomal Drug Delivery with a Focus on Ultrasound 2015, Bentham Science Publishers, pp. 16 (Year 2005).
"Acoustic Properties of Solids" ONDA Corporation, 592 Weddell Drive, Sunnyvale, CA 94089, Apr. 11, 2003, pp. 5 (Year 2003).
Bahreynl, B., "Fabrication and Design of Resonant Microdevices" Andrew William, Inc. 2018, NY (Year 2008).
Material Properties of Tibtech Innovations, © 2018 TIBTECH Innovations (Year 2018).
Bousquet, Marie e al. "Single-mode high frequency LiNbO3 Film Bulk Acoustic Resonator," 2019 IEEE International Ultrasonics Symposium (IUS), Glasgow, Scotland, Oct. 6-9, 2019, pp. 84-87.
Wikipedia contributors, "Quartz crystal microbalance," Wikipedia, The Free Encyclopedia, https://en.wikipedia.org/w/index. php?title=Quartz_crystal_microbalance&oldid=1009990186 (accessed Apr. 9, 2021).
Yantchev, Ventsislav & Katardjiev, Ilia. (2013). Thin film Lamb wave resonators in frequency control and sensing applications: A review. Journal of Micromechanics and Microengineering. 23. 043001. 10.1088/0960-1317/23/4/043001.
Wei Pang et al. "Analytical and experimental study on the second harmonic mode response of a bulk acoustic wave resonator" 2010 J. Micromech. Microeng. 20 115015; doi:10.1088/0960-1317/20/11/115015.
Durmus et al. "Acoustic-Based Biosensors" Encyclopedia of Microfluidics and Nanofluidics. DOI 10.1007/978-3-642-27758-0_10-2 Springer Science+Business Media New York 2014.
USPTO/ISA, International Search Report and Written Opinion for PCT Application No. PCT/US2023/017732 dated Jul. 27, 2023.
USPTO/ISA, International Search Report and Written Opinion for PCT Application No. PCT/US2022/082421 dated May 3, 2023.
USPTO/ISA, International Search Report and Written Opinion for PCT Application No. PCT/US2022/081095 dated May 30, 2023.
USPTO/ISA, International Search Report and Written Opinion for PCT Application No. PCT/US2022/079236 dated Mar. 10, 2023.
USPTO/ISA, International Search Report and Written Opinion for PCT Application No. PCT/US2022/081068 dated Apr. 18, 2023.
USPTO/ISA, International Search Report and Written Opinion for PCT Application No. PCT/US2022/080246 dated Mar. 30, 2023.
Gong et al., "Design and Analysis of Lithium-Niobate-Based High Electromechanical Coupling RF-MEMS Resonators for Wideband Filtering", IEEE Transactions on Microwave Theory and Techniques, vol. 61, No. 1, Jan. 2013, pp. 403-413.

* cited by examiner

DETAIL C

DETAIL C''

DETAIL C'''

DETAIL C'

DETAIL C'''

600C

Notes: Only one of actions 1010A, 1010B, 1010C is performed in each of three variations of the process 1000.

METAL-PIEZOELECTRIC-METAL CAPACITOR

CROSS REFERENCE TO RELATED APPLICATIONS

The present application claims priority to U.S. Patent Provisional Application No. 63/529,541, filed Jul. 28, 2023, the entire contents of which are hereby incorporated by reference.

TECHNICAL FIELD

This disclosure relates to radio frequency filters using acoustic wave resonators, and, more specifically, to filters using capacitors in parallel with acoustic resonators for use in communications equipment.

BACKGROUND

A radio frequency (RF) filter is a two-port device configured to pass some frequencies and to stop other frequencies, where "pass" means transmit with relatively low signal loss and "stop" means block or substantially attenuate. The range of frequencies passed by a filter is referred to as the "pass-band" of the filter. The range of frequencies stopped by such a filter is referred to as the "stop-band" of the filter. A typical RF filter has at least one pass-band and at least one stop-band. Specific requirements on a pass-band or stop-band may depend on the specific application. For example, in some cases a "pass-band" may be defined as a frequency range where the insertion loss of a filter is better than a defined value such as 1 dB, 2 dB, or 3 dB, while a "stop-band" may be defined as a frequency range where the rejection of a filter is greater than a defined value such as 20 dB, 30 dB, 40 dB, or greater depending on application.

RF filters are used in communications systems where information is transmitted over wireless links. For example, RF filters may be found in the RF front-ends of cellular base stations, mobile telephone and computing devices, satellite transceivers and ground stations, IoT (Internet of Things) devices, laptop computers and tablets, fixed point radio links, and other communications systems. RF filters are also used in radar and electronic and information warfare systems.

Performance enhancements to the RF filters in a wireless system can have broad impact on system performance. Improvements in RF filters can be leveraged to provide system performance improvements, such as larger cell size, longer battery life, higher data rates, greater network capacity, lower cost, enhanced security, higher reliability, etc. These improvements can be realized at many levels of the wireless system both separately and in combination, for example, at the RF module, RF transceiver, mobile or fixed sub-system, or network levels.

Moreover, the desire for wider communication channel bandwidths will inevitably lead to the use of higher frequency communications bands. Radio access technology for mobile telephone networks has been standardized by the 3GPP (3rd Generation Partnership Project). Radio access technology for 5th generation mobile networks is defined in the 5G NR (new radio) standard. The 5G NR standard defines several new communications bands. Two of these new communications bands are n77, which uses the frequency range from 3300 MHz to 4200 MHZ, and n79, which uses the frequency range from 4400 MHz to 5000 MHz. Bandpass filters for bands n77 and n79 must be capable of handling the transmit power of the communications device. However, current acoustic resonators have too much coupling for narrow bands, such as n79, and, thus, there is a need for improved filters that can operate at narrow frequency bands, while also improving the manufacturing processes for making such filters.

SUMMARY

Accordingly, as described herein, an acoustic resonator and filter device incorporating the same is provided in which a capacitor is coupled in parallel with an acoustic (XBAR) resonator to decrease the effective coupling of a resonator by shifting anti-resonance (Fa) lower in frequency.

Thus, according to an exemplary embodiment, an acoustic resonator is provided that includes a substrate; a piezoelectric layer coupled to the substrate by one or more dielectric layers and having first and second surfaces that oppose each other; an interdigital transducer (IDT) on at least one of the first and second surfaces of the piezoelectric layer and including interleaved fingers; and a capacitor electrically coupled in parallel to the IDT and including at least one first electrode on the first surface of the piezoelectric layer and a metal layer on the second surface of the piezoelectric layer, such that the piezoelectric layer is sandwiched between the at least one first electrode and the metal layer.

In another exemplary aspect of the acoustic resonator, the at least one first electrode is an anode of the capacitor and the metal layer is a cathode of the capacitor.

In another exemplary aspect of the acoustic resonator, the at least one first electrode comprises a pair of electrodes including an anode and a cathode of the capacitor. Moreover, in this aspect, the metal layer may be a floating metal.

In another exemplary aspect of the acoustic resonator, a portion of the piezoelectric layer forms a diaphragm that is over a cavity that extends at least partially in the one or more dielectric layers. In this aspect, the IDT can be disposed on the second surface of the piezoelectric layer that faces the cavity. Moreover, the IDT can be configured such that a radio frequency signal applied to the IDT excites a bulk shear acoustic wave in the diaphragm where acoustic energy propagates along a direction substantially orthogonal to a surface of the piezoelectric layer, which is transverse to a direction of an electric field created by the interleaved fingers of the IDT.

In another exemplary aspect, the acoustic resonator can include a Bragg mirror disposed between the piezoelectric layer and the substrate.

In another exemplary aspect of the acoustic resonator, the IDT comprises a first busbar and a second busbar that each extend in a first direction from a first end to a second end thereof, a first plurality of electrode fingers extending from the first busbar in a second direction towards the second busbar, with the second direction intersecting the first direction, and a second plurality of electrode fingers extending from the second busbar in the second direction towards to the first busbar, such that the first and second plurality of electrode fingers form the interleaved fingers of the IDT. Moreover, in this aspect, the at least one first electrode includes an anode of the capacitor that is coupled to the first busbar and extends in parallel to the first plurality of electrode fingers; and a cathode of the capacitor that is coupled to the second busbar and extends in parallel to the second plurality of electrode fingers.

In another exemplary aspect of the acoustic resonator, the piezoelectric layer comprises a pair of through holes that extend along sides of the at least one first electrode of the capacitor in a thickness direction of the piezoelectric layer.

In another exemplary aspect of the acoustic resonator, the piezoelectric layer comprises a first piezoelectric layer comprising a material with a first cut having a first crystallographic orientation; and a second piezoelectric layer attached to the first piezoelectric layer and comprising a material with a second cut having a second crystallographic orientation, such that a piezoelectric tensor of the second piezoelectric layer is an opposite polarity to a piezoelectric tensor of the first piezoelectric layer.

In yet another exemplary aspect, a filter device is provided that includes a plurality of bulk acoustic wave resonators. In this aspect, at least one of the plurality of bulk acoustic wave resonators comprises a substrate; a piezoelectric layer coupled to the substrate by one or more dielectric layers and having first and second surfaces that oppose each other; an interdigital transducer (IDT) on at least one of the first and second surfaces of the piezoelectric layer and including interleaved fingers; and a capacitor electrically coupled in parallel to the IDT and including at least one first electrode on the first surface of the piezoelectric layer and a metal layer on the second surface of the piezoelectric layer, such that the piezoelectric layer is sandwiched between the at least one first electrode and the metal layer.

In yet another exemplary aspect, a radio frequency module is provided that includes a filter device including a plurality bulk acoustic wave resonators connected in parallel; and a radio frequency circuit coupled to the filter device, the filter device and the radio frequency circuit being enclosed within a common package. In this aspect, at least one of the plurality of bulk acoustic wave resonators of the filter device includes a substrate; a piezoelectric layer coupled to the substrate by one or more dielectric layers and having first and second surfaces that oppose each other; an interdigital transducer (IDT) on at least one of the first and second surfaces of the piezoelectric layer and including interleaved fingers; and a capacitor electrically coupled in parallel to the IDT and including at least one first electrode on the first surface of the piezoelectric layer and a metal layer on the second surface of the piezoelectric layer, such that the piezoelectric layer is sandwiched between the at least one first electrode and the metal layer.

The above simplified summary of example aspects serves to provide a basic understanding of the present disclosure. This summary is not an extensive overview of all contemplated aspects and is intended to neither identify key or critical elements of all aspects nor delineate the scope of any or all aspects of the present disclosure. Its sole purpose is to present one or more aspects in a simplified form as a prelude to the more detailed description of the disclosure that follows. To the accomplishment of the foregoing, the one or more aspects of the present disclosure include the features described and exemplary pointed out in the claims.

BRIEF DESCRIPTION OF THE DRAWINGS

The accompanying drawings, which are incorporated into and form a part of this specification, illustrate one or more example aspects of the present disclosure and, together with the detailed description, serve to explain their principles and implementations.

Figure 1A:
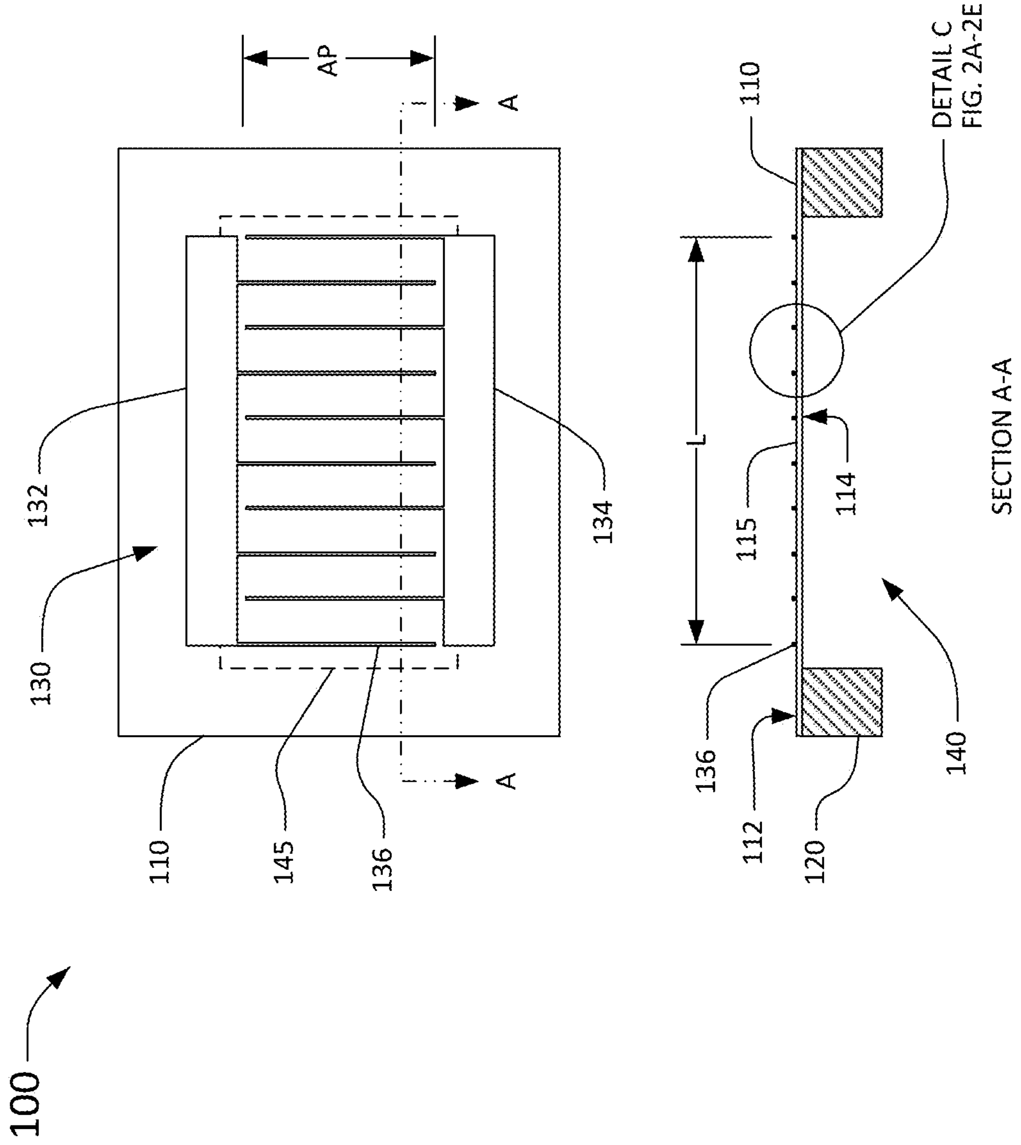
FIG. 1A includes a schematic plan view and a schematic cross-sectional view of a transversely-excited film bulk acoustic resonator (XBAR).

Throughout this description, elements appearing in figures are assigned three-digit or four-digit reference designators, where the two least significant digits are specific to the element and the one or two most significant digits are the figure number where the element is first introduced. An element that is not described in conjunction with a figure may be presumed to have the same characteristics and function as a previously described element having the same reference designator.

DETAILED DESCRIPTION

Various aspects of the disclosed bulk acoustic resonator, a filter device, a radio frequency module, and method of manufacturing the same are now described with reference to the drawings, wherein like reference numerals are used to refer to like elements throughout. In the following description, for purposes of explanation, numerous specific details are set forth in order to promote a thorough understanding of one or more aspects of the disclosure. It may be evident in some or all instances, however, that any aspects described below can be practiced without adopting the specific design details described below. In other instances, well-known structures and devices are shown in block diagram form in order to facilitate description of one or more aspects. The following presents a simplified summary of one or more aspects of the invention in order to provide a basic understanding thereof.

FIG. 1A shows a simplified schematic top view and an orthogonal cross-sectional view of a bulk acoustic resonator device, namely a transversely excited film bulk acoustic resonator (XBAR) 100. XBAR resonators, such as the resonator 100, may be used in a variety of RF filters including band-rejection filters, bandpass filters, duplexers, and multiplexers. XBARs are particularly suited for use in filters for communications bands with frequencies above 3 GHz.

In general, the XBAR 100 includes a conductor pattern (e.g., a thin film metal layer) formed at one or both surfaces of a piezoelectric layer 110 (herein piezoelectric plate or piezoelectric layer may be used interchangeably) having parallel front side 112 and a back side 114, respectively (also referred to generally first and second surfaces, respectively). It should be appreciated that the term "parallel" generally refers to the front side 112 and back side 114 being opposing to each other and that the surfaces are not necessarily planar and exactly parallel to each other. For example, due to the manufacturing variances result from the deposition process, the front side 112 and back side 114 may have undulations of the surface as would be appreciated to one skilled in the art. Moreover, the term "substantially" as used herein is used to describe when components, parameters and the like are generally the same (i.e., "substantially constant"), but may vary slightly (e.g., within an acceptable threshold or percentage) in practice due to possible manufacturing variances as would be appreciated to one skilled in the art. For purposes of this disclosure, the use of the term "or" in the claims is used to mean "and/or" unless explicitly indicated to refer to alternatives only or if the alternatives are mutually exclusive.

According to an exemplary aspect, the piezoelectric layer can be a thin single-crystal layer of a piezoelectric material, such as lithium niobate, lithium tantalate, lanthanum gallium silicate, gallium nitride, or aluminum nitride. It should be appreciated that the term "single-crystal" does not necessarily mean entirely of a uniform crystalline structure and may include impurities due to manufacturing variances as long as the crystal structure is within acceptable tolerances. The piezoelectric layer is cut such that the orientation of the X, Y, and Z crystalline axes with respect to the front and back sides is known and consistent. In the examples described herein, the piezoelectric layers are Z-cut, which is to say the Z axis is normal to the front and back sides 112, 114. However, XBARs may be fabricated on piezoelectric layers with other crystallographic orientations including rotated Z-cut, Y-cut and rotated YX cut.

The Y-cut family, such as 120Y and 128Y, are typically referred to as 120YX or 128YX, where the "cut angle" is the angle between the y axis and the normal to the layer. The "cut angle" is equal to $\beta$+90°. For example, a layer with Euler angles [0°, 30°, 0°] is commonly referred to as "120° rotated Y-cut" or "120Y." Thus, the Euler angles for 120YX and 128YX are (0, 120−90, 0) and (0, 128−90, 0) respectively. A "Z-cut" is typically referred to as a ZY cut and is understood to mean that the layer surface is normal to the Z axis but the wave travels along the Y axis. The Euler angles for ZY cut are (0, 0, 90).

The back side 114 of the piezoelectric layer 110 may be at least partially supported by a surface of the substrate 120 except for a portion of the piezoelectric layer 110 that forms a diaphragm 115 that is over (e.g., spanning or extending over) a cavity 140 in one or more layers below the piezoelectric layer 110 such as one or more intermediate layers above or in the substrate. In other words, the back side 114 of the piezoelectric layer 110 can be coupled or connected either directly or indirectly, via one or more intermediate layers (e.g., a dielectric layer, such as a silicon oxide layer), to a surface of the substrate 120. Moreover, the phrase "supported by" or "attached" may, as used herein interchangeably, mean attached directly, attached indirectly, mechanically supported, structurally supported, or any combination thereof. The portion of the piezoelectric layer that is over (e.g., spanning or extending over) the cavity can be referred to herein as a "diaphragm" 115 due to its physical resemblance to the diaphragm of a microphone. As shown in FIG. 1A, the diaphragm 115 is contiguous with the rest of the piezoelectric layer 110 around all of a perimeter 145 of the cavity 140. In this context, "contiguous" means "continuously connected without any intervening item". However, the diaphragm 115 can be configured with at least 50% of the edge surface of the diaphragm 115 coupled to the edge of the piezoelectric layer 110 in an exemplary aspect.

According to the exemplary aspect, the substrate 120 is configured to provide mechanical support to the piezoelectric layer 110. The substrate 120 may be, for example, silicon, sapphire, quartz, or some other material or combination of materials. The back side 114 of the piezoelectric layer 110 may be bonded to the substrate 120 using a wafer bonding process. Alternatively, the piezoelectric layer 110 may be grown on the substrate 120 or supported by, or attached to, the substrate in some other manner.

Figure 1B:
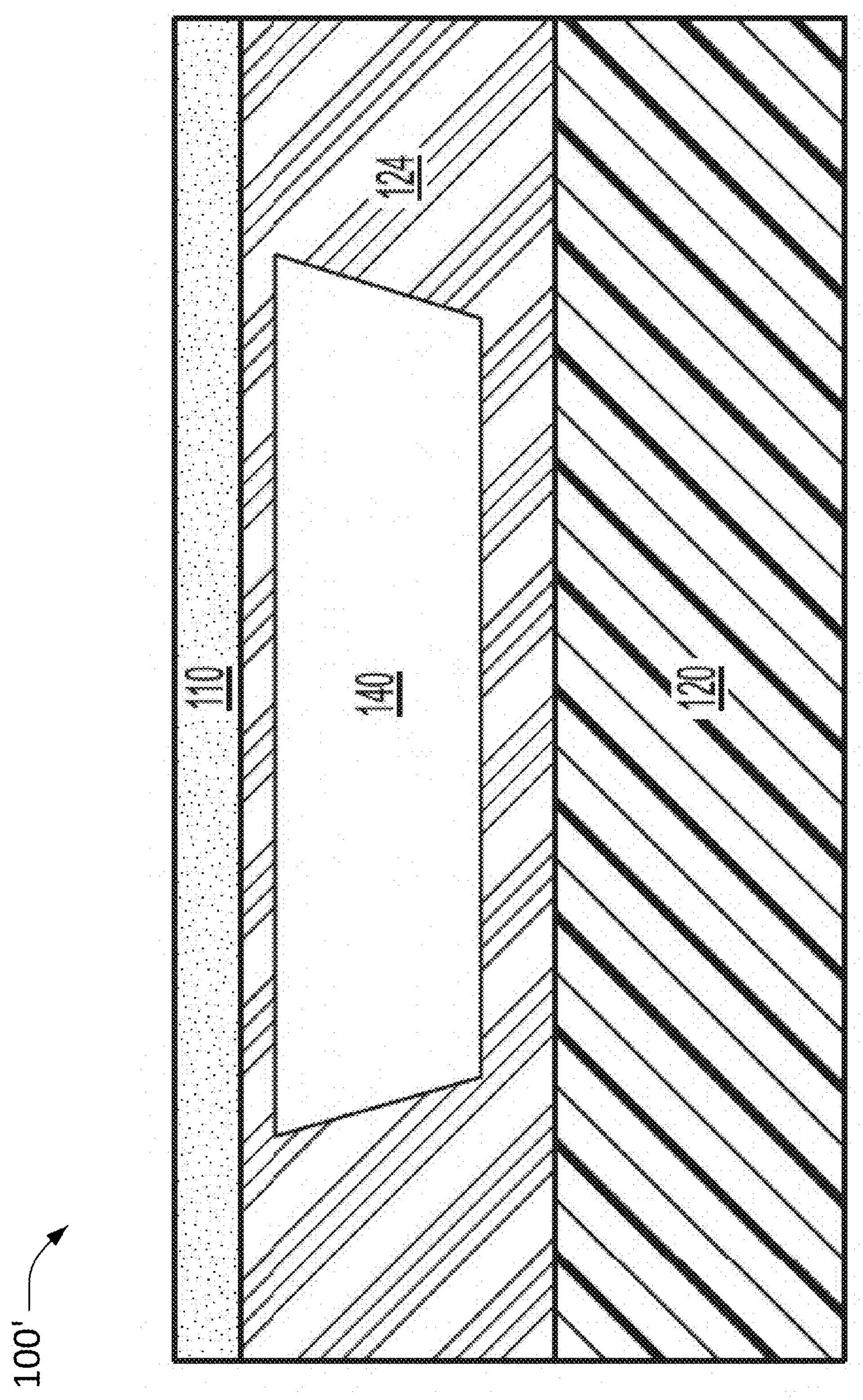
FIG. 1B shows a schematic cross-sectional view of an alternative configuration of an XBAR.

For purposes of this disclosure, "cavity" has its conventional meaning of "an empty space within a solid body." The cavity 140 may be a hole completely through the substrate 120 (as shown in Section A-A), a hole entirely or partially within a dielectric layer (as shown in FIG. 1B), or a recess in the substrate 120. The cavity 140 may be formed, for example, by selective etching of the substrate 120 before or after the piezoelectric layer 110 and the substrate 120 are attached, either directly or indirectly.

As shown, the conductor pattern of the XBAR 100 includes an interdigital transducer (IDT) 130. The IDT 130 includes a first plurality of parallel fingers, such as finger 136, extending from a first busbar 132 and a second plurality of fingers extending from a second busbar 134. The first and second pluralities of parallel fingers are interleaved with each other that can be "substantially" parallel to each other due to minor variations, such as due to manufacturing tolerances, for example. At least a portion of the interleaved fingers overlap for a distance AP, commonly referred to as the "aperture" of the IDT. The center-to-center distance L between the outermost fingers of the IDT 130 is the "length" of the IDT.

In the example of FIG. 1A, the IDT 130 is at the surface of the front side 112 (e.g., the first surface) of the piezoelectric layer 110. However, as discussed below, in other configurations, the IDT 130 may be at the surface of the back side 114 (e.g., the second surface) of the piezoelectric layer 110 or at both the surfaces of the front and back sides 112, 114 of the piezoelectric layer 110, respectively.

The first and second busbars 132, 134 are configured as the terminals of the XBAR 100 with the plurality of interleaved fingers extending therefrom. In operation, a radio frequency signal or microwave signal applied between the two busbars 132, 134 of the IDT 130 primarily excites an acoustic mode (i.e., a primarily shear acoustic mode) within the piezoelectric layer 110. As will be discussed in further detail, the primarily excited shear acoustic mode is a bulk shear mode or bulk acoustic wave where acoustic energy of a bulk shear acoustic wave is excited in the piezoelectric layer 110 by the IDT 130 and propagates along a direction substantially, predominantly, and/or primarily orthogonal to the surface of the piezoelectric layer 110, which is also primarily normal, or transverse, to the direction of the electric field created by the IDT fingers. That is, when a radio frequency or a microwave signal is applied between the two busbars 132, 134, the RF voltage applied to the respective sets of IDT fingers generates a time-varying electric field that is laterally excited with respect to a surface of the piezoelectric layer 110. Thus, in some cases the primarily excited acoustic mode may be commonly referred to as a laterally excited bulk acoustic wave since displacement, as opposed to propagation, occurs primarily in the direction of the bulk of the piezoelectric layer, as discussed in more detail below in reference to FIG. 4.

For purposes of this disclosure, "primarily acoustic mode" may generally refer to an operational mode in which a vibration displacement is caused in the primarily thickness-shear direction (e.g., X-direction), so the wave propagates substantially and/or primarily in the direction connecting the opposing front and back surfaces of the piezoelectric layer, that is, in the Z direction. In other words, the X-direction component of the wave is significantly smaller than the Z-direction component. The use of the term "primarily" in the "primarily excited acoustic mode" is not necessarily referring to a lower or higher order mode. Thus, the XBAR is considered a transversely excited film bulk wave resonator. One physical constraint is that when the radio frequency or microwave signal is applied between the two busbars 132, 134 of the IDT 130, heat is generated that must be dissipated from the resonator for improved performance. In general, heat can be dissipated by lateral conduction on the membrane (e.g., in the electrodes themselves), and vertical conduction through a cavity to substrate.

In any event, the IDT 130 is positioned at or on the piezoelectric layer 110 such that at least the fingers of the IDT extend at or on the portion of the piezoelectric layer 110 that is over the cavity 140, for example, the diaphragm 115 as described herein. As shown in FIG. 1A, the cavity 140 has a rectangular cross section with an extent greater than the aperture AP and length L of the IDT 130. According to other exemplary aspects, the cavity of an XBAR may have a different cross-sectional shape, such as a regular or irregular polygon. The cavity of an XBAR may have more or fewer than four sides, which may be straight or curved.

According to an exemplary aspect, the area of XBAR 100 is determined as the area of the IDT 130. For example, the area of the IDT 130 can be determined based on the measurement of the length L multiplied by the width of the aperture AP of the interleaved fingers of the IDT 130. As used herein through the disclosure, area is referenced in $\mu m^2$. Thus, the area of the XBAR 100 may be adjusted based on design choices, as described below, thereby adjusting the overall capacitance of the XBAR 100.

For ease of presentation in FIG. 1A, the geometric pitch and width of the IDT fingers is greatly exaggerated with respect to the length (dimension L) and aperture (dimension AP) of the XBAR. A typical XBAR has more than ten parallel fingers in the IDT. For example, an XBAR may have hundreds, possibly thousands, of parallel fingers in the IDT according to exemplary aspects. Similarly, the thickness of the fingers in the cross-sectional views is greatly exaggerated.

FIG. 1B shows a schematic cross-sectional view of an alternative XBAR configuration 100'. In FIG. 1B, the cavity 140 (which can correspond generally to cavity 140 of FIG. 1A) of the resonator 100' is formed entirely within a dielectric layer 124 (for example silicon oxide or silicon dioxide, as in FIG. 1B) that is located between the substrate 120 (indicated as Si in FIG. 1B) and the piezoelectric layer 110 (indicated as LN in FIG. 1B). Although a single dielectric layer 124 is shown having cavity 140 formed therein (e.g., by etching), it should be appreciated that the dielectric layer 124 can be formed by a plurality of separate dielectric layers formed on each other to provide a stack of materials.

Moreover, in the example of FIG. 1B, the cavity 140 is defined on all sides by the dielectric layer 124. However, in other exemplary embodiments, one or more sides of the cavity 140 may be defined by the substrate 120 and/or the piezoelectric layer 110. In the example of FIG. 1B, the cavity 140 has a trapezoidal shape. However, as noted above, cavity shape is not limited and may be rectangular, oval, or other shapes.

Figure 2A:
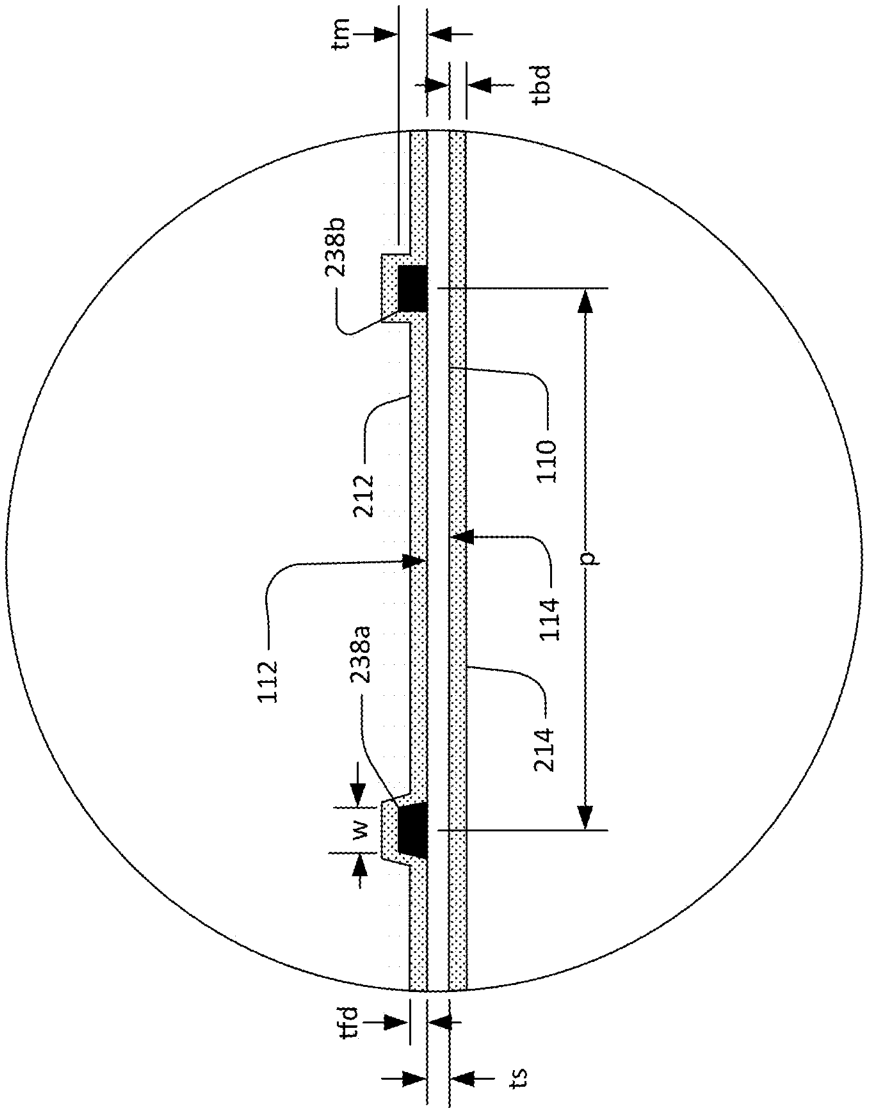
FIG. 2A is an expanded schematic cross-sectional view of a portion of the XBAR of FIG. 1A.

FIG. 2A shows a detailed schematic cross-sectional view (labeled as Detail C) of the XBAR 100 of FIG. 1A or 1B. The piezoelectric layer 110 is a single-crystal layer of piezoelectrical material having a thickness ts. Ts may be, for example, 100 nanometers (nm) to 1500 nm. When used in filters for 5G NR and Wi-Fi™ bands from 3.4 GHZ to 7 GHZ, the thickness ts may be, for example, 150 nm to 500 nm. The thickness ts can be measured in a direction substantially perpendicular or orthogonal to a surface of the piezoelectric layer in an exemplary aspect.

In this aspect, a front side dielectric layer 212 (e.g., a first dielectric coating layer or material) can be formed on the front side 112 of the piezoelectric layer 110. The "front side" of the XBAR is, by definition, the surface facing away from the substrate. The front side dielectric layer 212 has a thickness tfd. As shown in FIG. 2A the front side dielectric layer 212 covers the IDT fingers 238*a*, 238*b*, which can correspond to fingers 136 as described above with respect to FIG. 1A. Although not shown in FIG. 2A, the front side dielectric layer 212 may also be deposited only between the IDT fingers 238*a*, 238*b*. In this case, an additional thin dielectric layer (not shown) may be deposited over the IDT fingers to seal and passivate the fingers. Further, although also not shown in FIG. 2A, the front side dielectric layer 212 may also be deposited only on select IDT fingers 238*a*, for example.

A back side dielectric layer 214 (e.g., a second dielectric coating layer or material) can also be formed on the back side of the back side 114 of the piezoelectric layer 110. In general, for purposes of this disclosure, the term "back side" means on a side opposite the conductor pattern of the IDT structure and/or opposite the front side dielectric layer 212. Moreover, the back side dielectric layer 214 has a thickness tbd. The front side and back side dielectric layers 212, 214 may be a non-piezoelectric dielectric material, such as silicon oxide, silicon dioxide or silicon nitride. Tfd and tbd may be, for example, 0 to 500 nm. Tfd and tbd may be less than the thickness ts of the piezoelectric layer. Tfd and tbd are not necessarily equal, and the front side and back side dielectric layers 212, 214 are not necessarily the same material. In exemplary aspects, either or both of the front side and back side dielectric layers 212, 214 may be formed of multiple layers of two or more materials according to various exemplary aspects.

The IDT fingers 238*a*, 238*b* may comprise aluminum, substantially (i.e., predominantly) aluminum alloys, copper, substantially (i.e., predominantly) copper alloys, beryllium, gold, or some other conductive material. Thin (relative to the total thickness of the conductors) layers of other metals, such as chromium or titanium, may be formed under and/or over the fingers to improve adhesion between the fingers and the piezoelectric layer 110 and/or to passivate or encapsulate the fingers. The busbars (132, 134 in FIG. 1A) of the IDT may be made of the same or different materials as the fingers. The cross-sectional shape of the IDT fingers may be trapezoidal (finger 238*a*), rectangular (finger 238*b*) or some other shape in various exemplary aspects. In general, it is noted that the terms "comprise", "have", "include" and "contain" (and their variants) as used herein are open-ended linking verbs and allow the addition of other elements when used in a claim. Moreover, the use of the word "a" or "an" when used in conjunction with the term "comprising" in the claims or the specification means one or more than one, unless the context dictates otherwise.

Dimension p (i.e., the "pitch") can be considered the center-to-center spacing between adjacent IDT fingers, such as the IDT fingers 238*a*, 238*b* in FIGS. 2A-2D. Center points of center-to-center spacing may be measured at a center of the width "w" of a finger as shown in FIG. 2A. In some cases, the center-to-center spacing may change if the width of a given finger changes along the length of the finger, if the width and extending direction changes, or any variation thereof. In that case, for a given location along AP, center-to-center spacing may be measured as an average center-to-center spacing, a maximum center-to-center spacing, a minimum center-to-center spacing, or any variation thereof. Adjacent fingers may each extend from a different busbar and center-to-center spacing may be measured from a center of a first finger extending from a first busbar to a center of a second finger, adjacent to the first finger, extending from a second busbar. The center-to-center spacing may be constant over the length of the IDT, in which case the dimension p may be referred to as the pitch of the IDT and/or the pitch of the XBAR. However, in an alternative exemplary aspect, the center-to-center spacing varies along the length of the IDT, in which case the pitch of the IDT may be the average value of dimension p over the length of the IDT. Center-to-center spacing from one finger to an adjacent finger may vary continuously when compared to other adjacent fingers, in discrete sections of multiple adjacent pairs, or any combination thereof. Each IDT finger, such as the IDT fingers 238*a*, 238*b* in FIGS. 2A to 2D, has a width w measured normal to the long direction of each finger. The width w may also be referred to herein as the "mark." In general, the width of the IDT fingers may be constant over the length of the IDT, in which case the dimension w may be the width of each IDT finger. However, in another exemplary aspect as will be discussed below, the width of individual IDT fingers varies along the length of the IDT 130, in which case dimension w may be the average value of the widths of the IDT fingers over the length of the IDT. Note that the pitch p and the width w of the IDT fingers are measured in a direction substantially parallel to the length L of the IDT, as defined in FIG. 1A.

In general, the IDT of an XBAR differs substantially from the IDTs used in surface acoustic wave (SAW) resonators, primarily in that IDTs of an XBAR excite a primary shear acoustic mode (also referred to as a primary shear mode, a primary shear thickness mode, or the like), as described in more detail below with respect to FIG. 4, where SAW resonators excite a surface wave in operation. Moreover, in a SAW resonator, the pitch of the IDT is one-half of the acoustic wavelength at the resonance frequency. Additionally, the mark-to-pitch ratio of a SAW resonator IDT is typically close to 0.5 (i.e., the mark or finger width is about one-fourth of the acoustic wavelength at resonance). In an XBAR, the pitch p of the IDT is typically 2 to 20 times the width w of the fingers. In addition, the pitch p of the IDT is typically 2 to 20 times the thickness ts of the piezoelectric layer 110. Moreover, the width of the IDT fingers in an XBAR is not constrained to one-fourth of the acoustic wavelength at resonance. For example, the width of XBAR IDT fingers may be 500 nm or greater, such that the IDT can be fabricated using optical lithography. The thickness tm of the IDT fingers may be from 100 nm to about equal to the width w, as the lithography process typically cannot support a configuration where the thickness is greater than the width. The thickness of the busbars (132, 134 in FIG. 1A) of the IDT may be the same as, less than, greater than, or any combination thereof, the thickness tm of the IDT fingers. It is noted that the XBAR devices described herein are not limited to the ranges of dimensions described herein.

Moreover, unlike a SAW filter, the resonance frequency of an XBAR is dependent on the total thickness of its diaphragm (i.e., in the vertical or thickness direction), including the piezoelectric layer 110, and the front side and back side dielectric layers 212, 214 disposed thereon. In an exemplary aspect, the thickness of one or both dielectric layers (i.e., on the opposing surfaces of the piezoelectric layer) can be varied to change the resonance frequencies of various XBARs in a filter. For example, shunt resonators in a ladder filter circuit may incorporate thicker dielectric layers to reduce the resonance frequencies of the shunt resonators relative to series resonators with thinner dielectric layers, and thus a thinner overall thickness.

Referring back to FIG. 2A, the thickness tfd of the front side dielectric layer 212 over the IDT fingers 238*a*, 238*b* may be greater than or equal to a minimum thickness required to cover and passivate the IDT fingers and other conductors on the front side 112 to the piezoelectric layer 110. The minimum thickness may be, for example, 10 nm to 50 nm depending on the material of the front side dielectric layer and method of deposition according to an exemplary aspect. The thickness of the back side dielectric layer 214 may be configured to a specific thickness to adjust the resonance frequency of the resonator as will be described in more detail below.

Although FIG. 2A discloses a configuration in which IDT fingers 238*a* and 238*b* are at the front side 112 of the piezoelectric layer 110, alternative configurations can be provided. For example, FIG. 2B shows an alternative configuration (identified as Detail C') in which the IDT fingers 238*a*, 238*b* are at the back side 114 of the piezoelectric layer 110 (i.e., facing the cavity) and are covered by a back side dielectric layer 214. A front side dielectric layer 212 may cover the front side 112 of the piezoelectric layer 110. In exemplary aspects, a dielectric layer disposed on the diaphragm of each resonator can be trimmed or etched to adjust the resonant frequency. However, if the dielectric layer is on the side of the diaphragm facing the cavity, there may be a change in spurious modes (e.g., generated by the coating on the fingers). Moreover, with the passivation layer coated on top of the IDTs, the mark changes, which can also cause spurs. Therefore, disposing the IDT fingers 238*a*, 238*b* at the back side 114 of the piezoelectric layer 110 as shown in FIG. 2B may eliminate addressing both the change in frequency as well as the effect it has on spurs as compared when the IDT fingers 238*a* and 238*b* are on the front side 112 of the piezoelectric layer 110.

Figure 2C:
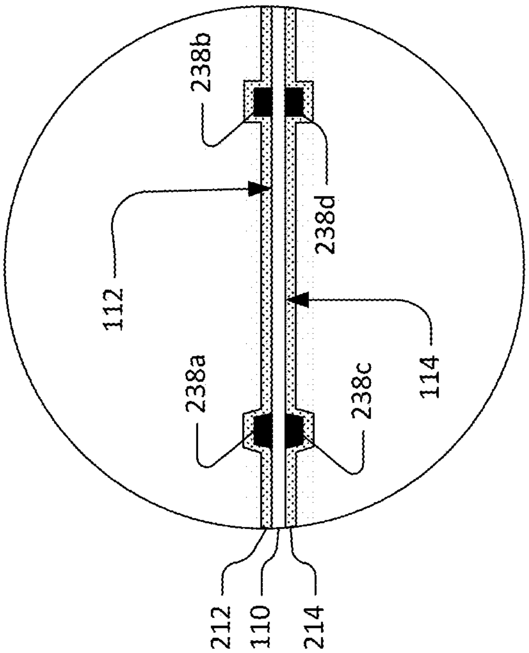
FIG. 2C is an expanded schematic cross-sectional view of another alternative configuration of the XBAR of FIG. 1A.

FIG. 2C shows an alternative configuration (identified as Detail C") in which IDT fingers 238*a*, 238*b* are on the front side 112 of the piezoelectric layer 110 and are covered by a front side dielectric layer 212. IDT fingers 238*c*, 238*d* are also on the back side 114 of the piezoelectric layer 110 and are also covered by a back side dielectric layer 214. As previously described, the front side and back side dielectric layer 212, 214 are not necessarily the same thickness or the same material.

Figure 2D:
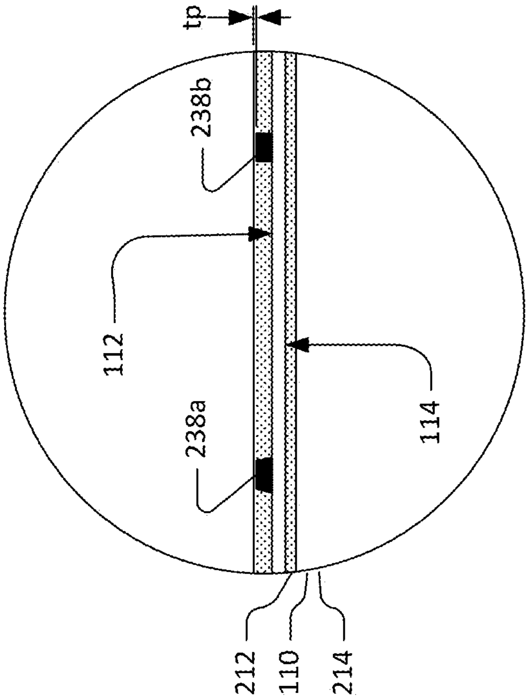
FIG. 2D is an expanded schematic cross-sectional view of another alternative configuration of the XBAR of FIG. 1A.
Figure 2B:
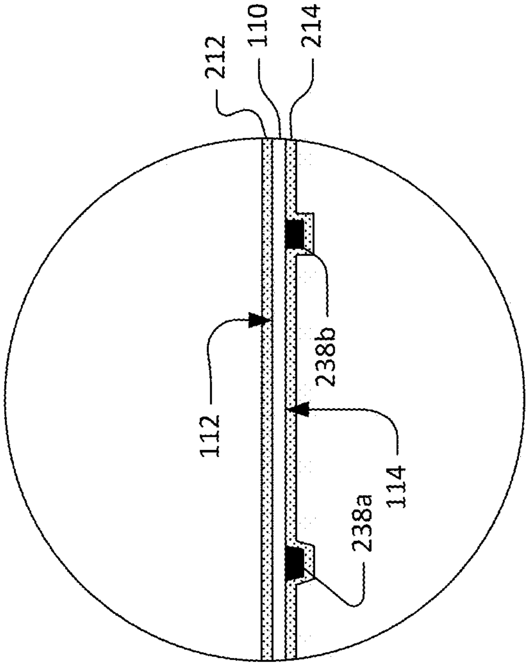
FIG. 2B is an expanded schematic cross-sectional view of an alternative configuration of the XBAR of FIG. 1A.

FIG. 2D shows another alternative configuration (identified as Detail C'") in which IDT fingers 238*a*, 238*b* are on the front side 112 of the piezoelectric layer 110 and are covered by a front side dielectric layer 212. The surface of the front side dielectric layer is planarized. The front side dielectric layer may be planarized, for example, by polishing or some other method. A thin layer of dielectric material having a thickness tp may cover the IDT finger 238*a*, 238*b* to seal and passivate the fingers. The dimension TP may be, for example, 10 nm to 50 nm.

Each of the XBAR configurations described above with respect to FIGS. 2A to 2D include a diaphragm spanning over a cavity. However, in an alternative aspect, the bulk acoustic resonator can be solidly mounted in which the diaphragm with IDT fingers is mounted on or above a Bragg mirror, which in turn can be mounted on a substrate.

Figure 2E:
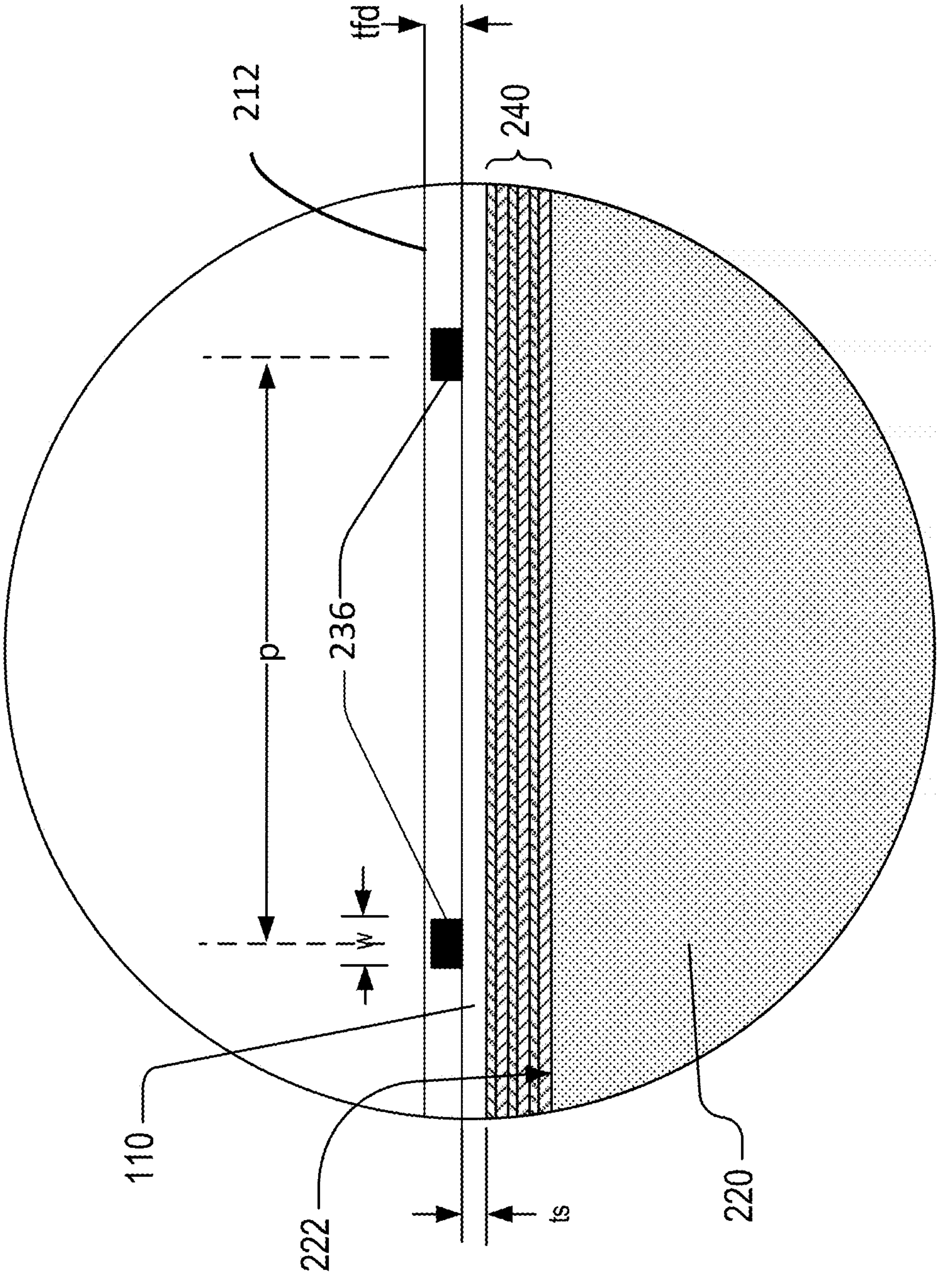
FIG. 2E is an expanded schematic cross-sectional view of a portion of a solidly-mounted XBAR (SM XBAR).

In particular, FIG. 2E shows a detailed schematic cross-sectional view of a solidly mounted XBAR (SM-XBAR). It is noted that FIG. 2E generally discloses a similar cross section as that of FIG. 1A, except having a solidly mounted configuration. In this aspect, the SM-XBAR includes a piezoelectric layer 110 and an IDT (of which only two fingers 236 are visible) with a dielectric layer 212 disposed on the piezoelectric layer 110 and IDT fingers 236. The piezoelectric layer 110 has parallel front and back surfaces similar to the configurations described above. Dimension ts is the thickness of the piezoelectric layer 110. The width of the IDT fingers 236 is dimension w, thickness of the IDT fingers is dimension tm, and the IDT pitch is dimension p.

In contrast to the XBAR devices shown in FIG. 1A, the IDT of an SM XBAR in FIG. 2E is not formed on a diaphragm spanning a cavity in the substrate. Instead, an acoustic Bragg reflector 240 is sandwiched between a surface 222 of the substrate 220 and the back surface of the piezoelectric layer 110. The term "sandwiched" means the acoustic Bragg reflector 240 is both disposed between and mechanically attached to a surface 222 of the substrate 220 and the back surface of the piezoelectric layer 110. In some circumstances, layers of additional materials (e.g., one or more dielectric layers) may be disposed between the acoustic Bragg reflector 240 and the surface 222 of the substrate 220 and/or between the Bragg reflector 240 and the back surface of the piezoelectric layer 110. Such additional material layers may be present, for example, to facilitate bonding the piezoelectric layer 110, the acoustic Bragg reflector 240, and the substrate 220.

The acoustic Bragg reflector 240 may be an acoustic mirror configured to reflect at least a portion of the primary acoustic mode excited in the piezoelectric and includes multiple dielectric layers that alternate between materials having high acoustic impedance and materials having low acoustic impedance. The acoustic impedance of a material is the product of the material's shear wave velocity and density. "High" and "low" are relative terms. For each layer, the standard for comparison is the adjacent layers. Each "high" acoustic impedance layer has an acoustic impedance higher than that of both the adjacent low acoustic impedance layers. Each "low" acoustic impedance layer has an acoustic impedance lower than that of both the adjacent high acoustic impedance layers. As discussed above, the primary acoustic mode in the piezoelectric layer of an XBAR is a shear bulk wave. In an exemplary aspect, each layer of the acoustic Bragg reflector 240 has a thickness equal to, or about, one-fourth of the wavelength in the layer of a shear bulk wave having the same polarization as the primary acoustic mode at or near a resonance frequency of the SM XBAR. Dielectric materials having comparatively low acoustic impedance include silicon dioxide, carbon-containing silicon oxide, and certain plastics such as cross-linked polyphenylene polymers. Materials having comparatively high acoustic impedance include hafnium oxide, silicon nitride, aluminum nitride, silicon carbide. All of the high acoustic impedance layers of the acoustic Bragg reflector 240 are not necessarily the same material, and all of the low acoustic impedance layers are not necessarily the same material. In the example of FIG. 2E, the acoustic Bragg reflector 240 has a total of six layers, but an acoustic Bragg reflector may have more than, or less than, six layers in alternative configurations.

The IDT fingers, such as IDT finger 236, 238*a*, and 238*b*, may be disposed on a surface of the front side 112 of the piezoelectric layer 110. Alternatively, IDT fingers, such as IDT finger 236, 238*a*, and 238*b*, may be disposed in grooves formed in the surface of the front side 112. The grooves may extend partially through the piezoelectric layer. Alternatively, the grooves may extend completely through the piezoelectric layer.

Figure 3A:
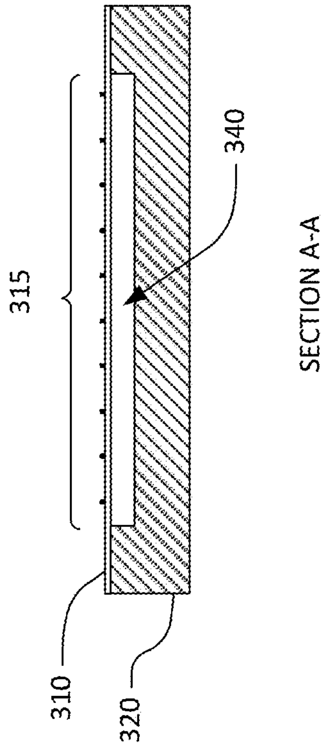
FIG. 3A is a schematic cross-sectional view of an XBAR according to an exemplary aspect.
Figure 3B:
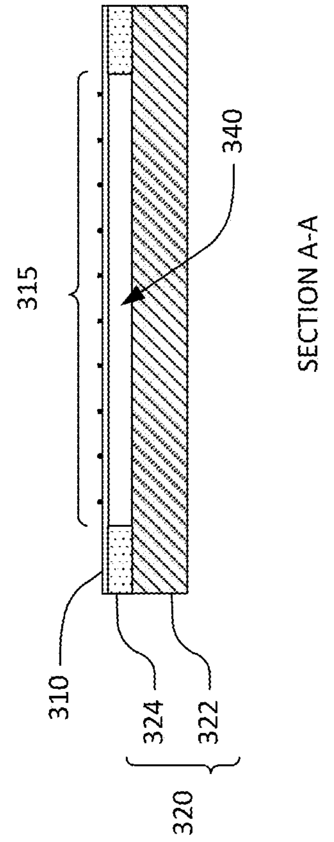
FIG. 3B is an alternative schematic cross-sectional view of an XBAR according to an exemplary aspect.

FIG. 3A and FIG. 3B show two exemplary cross-sectional views along the section plane A-A defined in FIG. 1A of XBAR 100. In FIG. 3A, a piezoelectric layer 310, which corresponds to piezoelectric layer 110, is attached directly to a substrate 320, which can correspond to substrate 120 of FIG. 1A. Moreover, a cavity 340, which does not fully penetrate the substrate 320, is formed in the substrate under the portion (i.e., the diaphragm 315) of the piezoelectric layer 310 containing the IDT of an XBAR. The cavity 340 can correspond to cavity 140 of FIGS. 1A and/or 1B in an exemplary aspect. In an exemplary aspect, the cavity 340 may be formed, for example, by etching the substrate 320 before attaching the piezoelectric layer 310. Alternatively, the cavity 340 may be formed by etching the substrate 320 with a selective etchant that reaches the substrate through one or more openings provided in the piezoelectric layer 310.

FIG. 3B illustrates an alternative aspect in which the substrate 320 includes a base 322 and an intermediate layer 324 that is disposed between the piezoelectric layer 310 and the base 322. For example, the base 322 may be silicon (e.g., a silicon support substrate) and the intermediate layer 324 may be silicon dioxide or silicon nitride or some other material, e.g., an intermediate dielectric layer. That is, in this aspect, the base 322 and the intermediate layer 324 are collectively considered the substrate 320. As further shown, cavity 340 is formed in the intermediate layer 324 under the portion (i.e., the diaphragm 315) of the piezoelectric layer 310 containing the IDT fingers of an XBAR. The cavity 340 may be formed, for example, by etching the intermediate layer 324 before attaching the piezoelectric layer 310. Alternatively, the cavity 340 may be formed by etching the intermediate layer 324. In other example embodiments, the cavity 340 may be defined in the intermediate layer 324 by other means from whether the intermediate layer 324 was etched to define the cavity 340. In some cases, the etching may be performed with a selective etchant that reaches the substrate through one or more openings (not shown) provided in the piezoelectric layer 310.

In this case, the diaphragm 315, which can correspond to diaphragm 115 of FIG. 1A, for example, in an exemplary aspect, may be contiguous with the rest of the piezoelectric layer 310 around a large portion of a perimeter of the cavity 340. For example, the diaphragm 315 may be contiguous with the rest of the piezoelectric layer 310 around at least 50% of the perimeter of the cavity 340. As shown in FIG. 3B, the cavity 340 extends completely through the intermediate layer 324. That is, the diaphragm 315 can have an outer edge that faces the piezoelectric layer 310 with at least 50% of the edge surface of the diaphragm 315 coupled to the edge of the piezoelectric layer 310 facing the diaphragm 315. This configuration provides for increased mechanical stability of the resonator.

In other configurations, the cavity 340 may partially extend into, but not entirely through the intermediate layer 324 (i.e., the intermediate layer 324 may extend over the bottom of the cavity on top of the base 322) or may extend through the intermediate layer 324 and into (either partially or wholly) the base 322. As described above, it should be appreciated that the interleaved fingers of the IDT can be disposed on either or both surfaces of the diaphragm 315 in FIGS. 3A and 3B according to various exemplary aspects.

Figure 4:
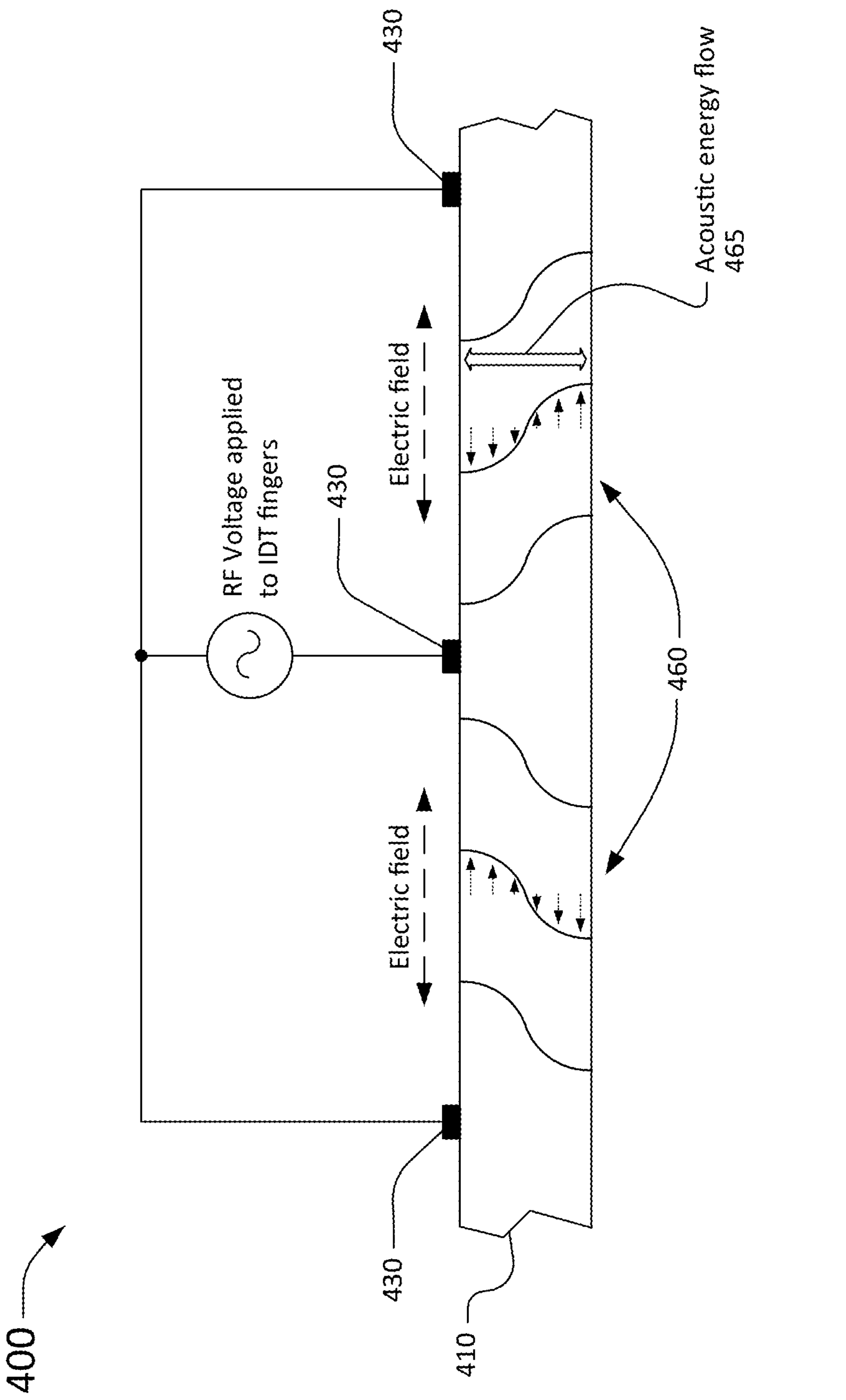
FIG. 4 is a graphic illustrating a shear horizontal acoustic mode in an XBAR.

FIG. 4 is a graphical illustration of the primarily excited acoustic mode of interest in an XBAR. FIG. 4 shows a small portion of an XBAR 400 including a piezoelectric layer 410 and three interleaved IDT fingers 430. In general, the exemplary configuration of XBAR 400 can correspond to any of the configurations described above and shown in FIGS. 2A to 2D according to an exemplary aspect. Thus, it should be appreciated that piezoelectric layer 410 can correspond to piezoelectric layer 110 and IDT fingers 430 can be implemented according to any of the configurations of fingers 238*a* and 238*b*, for example.

In operation, an RF voltage is applied to the interleaved fingers 430. This voltage creates a time-varying electric field between the fingers. The direction of the electric field is lateral (i.e., laterally excited), or primarily parallel to the surface of the piezoelectric layer 410, as indicated by the arrows labeled "electric field." Due to the high dielectric constant of the piezoelectric layer 410, the electric field is highly concentrated in the piezoelectric layer relative to the air. The lateral electric field introduces shear deformation in the piezoelectric layer 410, and thus strongly excites a shear acoustic mode, in the piezoelectric layer 410. In this context, "shear deformation" is defined as deformation in which parallel planes in a material remain parallel and maintain a constant distance while translating relative to each other. In other words, the parallel planes of material are laterally displaced with respect to each other. A "shear acoustic mode" is defined as an acoustic vibration mode in a medium that results in shear deformation of the medium. The shear deformations in the XBAR 400 are represented by the curves 460, with the adjacent small arrows providing a schematic indication of the direction and magnitude of atomic motion. It is noted that the degree of atomic motion, as well as the thickness of the piezoelectric layer 410, have been exaggerated for ease of visualization in FIG. 4. While the atomic motions are predominantly lateral (i.e., horizontal as shown in FIG. 4), the direction of acoustic energy flow of the primarily excited shear acoustic mode is substantially and/or primarily orthogonal to the surface of the piezoelectric layer, as indicated by the arrow 465.

A bulk acoustic resonator based on shear acoustic wave resonances can achieve better performance than current state-of-the art film-bulk-acoustic-resonators (FBAR) and solidly-mounted-resonator bulk-acoustic-wave (SMR BAW) devices where the electric field is applied in the thickness direction. In such devices, the acoustic mode is compressive with atomic motions and the direction of acoustic energy flow in the thickness direction. In addition, the piezoelectric coupling for shear wave XBAR resonances can be high (>20%) compared to other acoustic resonators. Thus, high piezoelectric coupling enables the design and implementation of microwave and millimeter-wave filters with appreciable bandwidth.

Figure 5A:
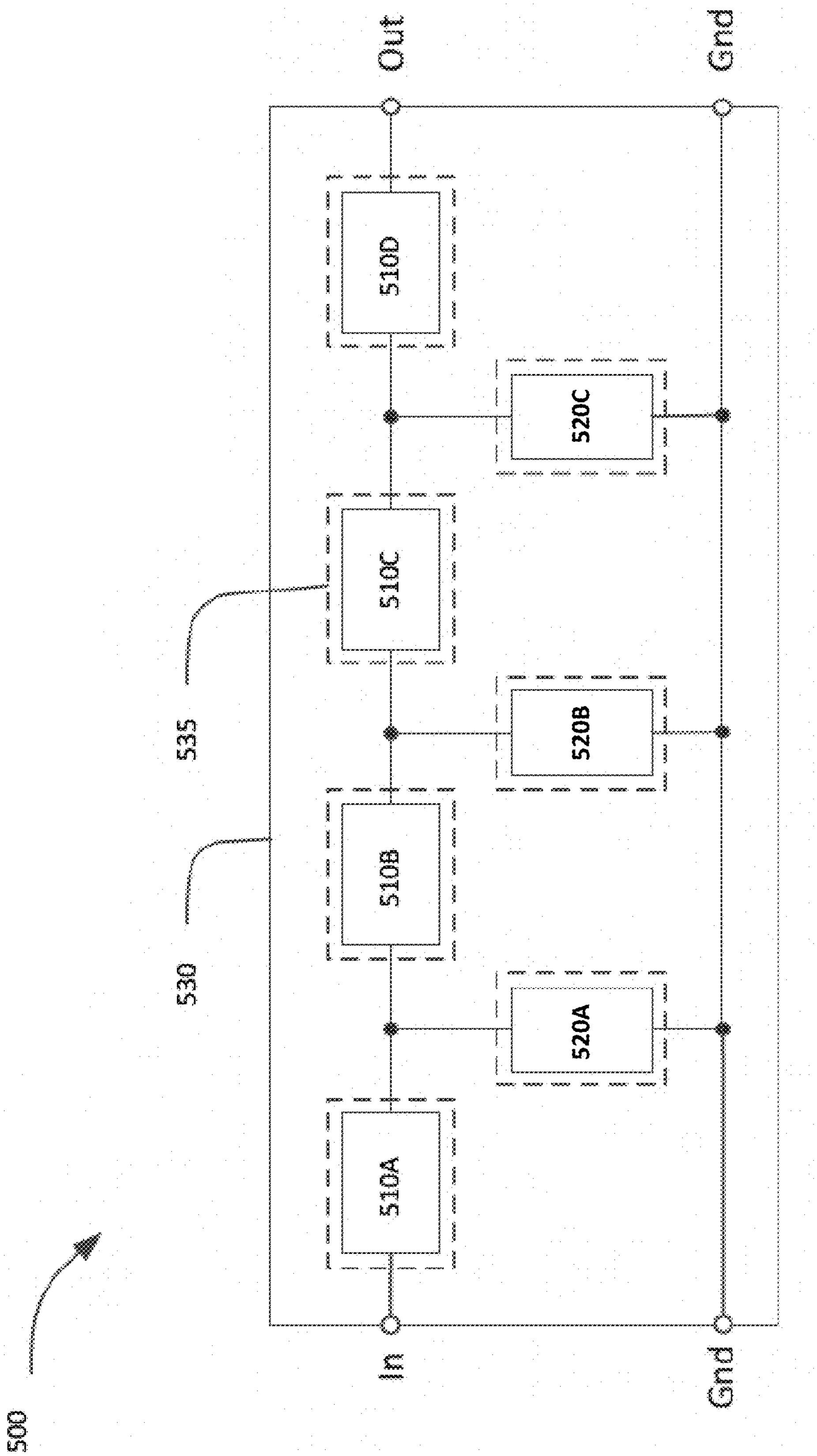
FIG. 5A is a schematic block diagram of a filter using XBARs of FIGS. 1A and/or 1B.

FIG. 5A is a schematic circuit diagram and layout for a high frequency bandpass filter 500 using a plurality of bulk acoustic wave resonators (e.g., XBARs), such as the general XBAR configuration 100 (e.g., the bulk acoustic wave resonators) described above, for example. The filter 500 has a conventional ladder filter architecture, which may include a split-ladder filter architecture wherein the filter is split between multiple chips, that has a plurality of bulk acoustic resonators including four resonators 510A, 510B, 510C, and 510D and three shunt resonators 520A, 520B and 520C. The series resonators 510A, 510B, 510C and 510D are connected in series between a first port and a second port (hence the term "series resonator"). In FIG. 5A, the first and second ports are labeled "In" and "Out", respectively. However, the filter 500 is bidirectional and either port may serve as the input or output of the filter. At least two shunt resonators, such as the shunt resonators 520A and 520B, are connected from nodes between series resonators to a ground connection. A filter may contain additional reactive components, such as inductors, not shown in FIG. 5A. All the shunt resonators and series resonators are XBARs (e.g., either of the XBAR configurations 100 and/or 100' as discussed above) in the exemplary aspect. The inclusion of three series and two shunt resonators is an example. A filter may have more or fewer than five total resonators, more or fewer than three series resonators, and more or fewer than two shunt resonators. Typically, for a split ladder and non-split-ladder filter architectures, all of the series resonators are connected in series between an input and an output of the filter, and all of the shunt resonators are typically connected between ground and the input, the output, or a node between two series resonators.

In the exemplary filter 500, the series resonators 510A, 510B, 510C and 510D and the shunt resonators 520A, 520B and 520C of the filter 500 can be formed on at least one, and in some cases a single, piezoelectric layer 530 of piezoelectric material bonded to a silicon substrate (not visible). However, in alternative aspects, the individual resonators may each be formed on a separate respective piezoelectric layer for each resonator wherein all resonators are located on the same chip. In some cases, however different resonators of a filter may be bonded to a separate substrate, for example. This may result in a split-ladder architecture that can include one or a plurality of separate chips that include separate piezoelectric layers and IDTs of one or more bulk acoustic resonators that are then configured together to form the overall split ladder filter. Moreover, each resonator includes a respective IDT (not shown), with at least the fingers of the IDT disposed over a cavity, or an acoustic mirror, in the substrate. In this and similar contexts, the term "respective" means "relating things each to each," which is to say with a one-to-one correspondence. In FIG. 5A, the cavities are illustrated schematically as the dashed rectangles (such as the rectangle 535). In this example, each IDT is disposed over a respective cavity. In other filters, the IDTs of two or more resonators may be disposed over a single cavity.

Each of the resonators 510A, 510B, 510C, 510D, 520A, 520B and 520C in the filter 500 has a resonance where the admittance (also interchangeably referred to as Y-parameter) of the resonator is very high and an anti-resonance where the admittance of the resonator is very low. The resonance and anti-resonance occur at a resonance frequency and an anti-resonance frequency, respectively, which may be the same or different for the various resonators in the filter 500. In simplified terms, each resonator can be considered a short-circuit at its resonance frequency and an open circuit at its anti-resonance frequency. The input-output transfer function will be near zero at the resonance frequencies of the shunt resonators and at the anti-resonance frequencies of the series resonators. In a typical filter, the resonance frequencies of the shunt resonators are positioned below the lower edge of the filter's passband and the anti-resonance frequencies of the series resonators are positioned above the upper edge of the passband.

The frequency range between resonance and anti-resonance frequencies of a resonator corresponds to the coupling of the resonator. Depending on the design parameters of the filter 500, each of the resonators 510A, 510B, 510C, 510D, 520A, 520B and 520C may have a particular coupling parameter to which the respective resonator is tuned in order to achieve the required frequency response of the filter 500.

According to an exemplary aspect, each of the series resonators 510A, 510B, 510C and 510D and the shunt resonators 520A, 520B and 520C can have an XBAR configuration as described above with respect to FIGS. 1A-2D in which a diaphragm with IDT fingers spans over a cavity. Alternatively, each of the series resonators 510A, 510B, 510C, 510D and the shunt resonators 520A, 520B, and 520C can have an XBAR configuration in which the series resonators 510A, 510B, 510C, 510D and/or the shunt resonators 520A, 520B, and 520C can be solidly mounted on or above a Bragg mirror (e.g., as shown in FIG. 2E), which in turn can be mounted on a substrate. Moreover, as will be described below, exemplary aspects include a resonator with a plate capacitor coupled in parallel thereto to reduce the coupling coefficient. Accordingly, the filter 500 can include a plurality of capacitors that are electrically coupled in parallel to the plurality of IDTs, respectively, as will become apparent to those skilled in the art. Moreover, as described in detail below, each of the capacitors includes at least one first electrode on a first main surface of the piezoelectric layer and a metal layer (e.g., a second electrode) on a second main surface of the piezoelectric layer, such that the at least one piezoelectric layer is sandwiched between the first electrode and the metal layer. The details of the exemplary capacitor structures will be described as follows.

Figure 5B:
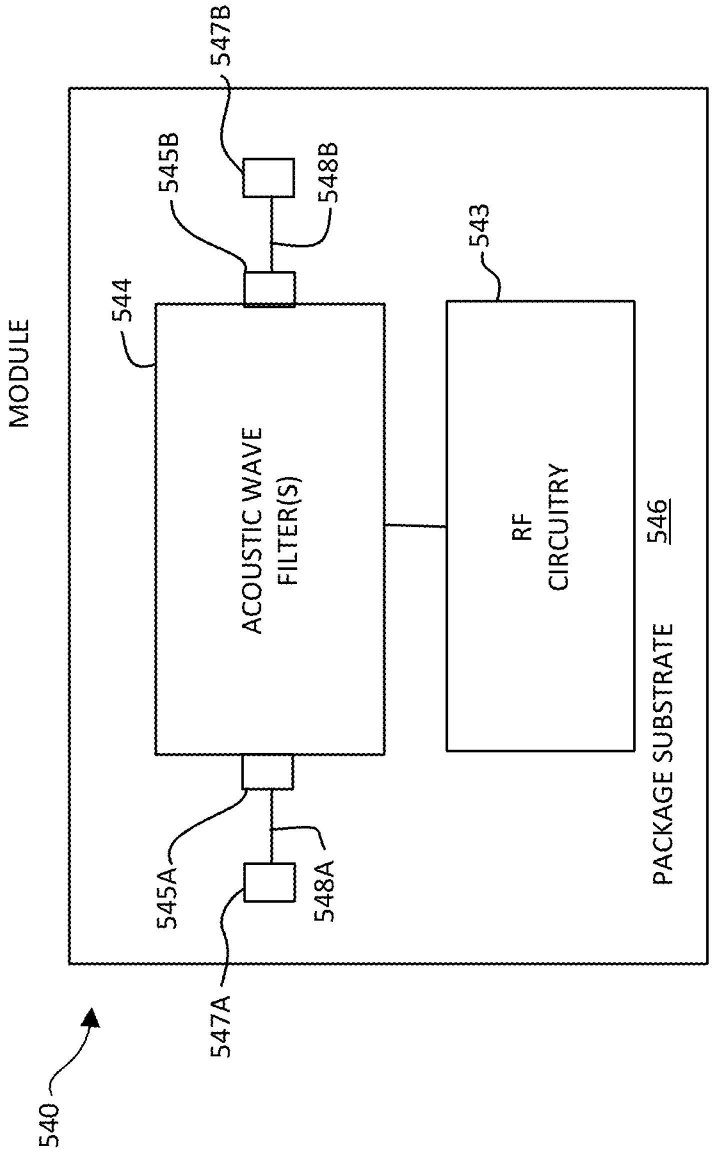
FIG. 5B is a schematic diagram of a radio frequency module that includes an acoustic wave filter device according to an exemplary aspect.

FIG. 5B is a schematic diagram of a radio frequency module that includes an acoustic wave filter device according to an exemplary aspect. In particular, FIG. 5B illustrate a radio frequency module 540 that includes one or more acoustic wave filters 544 according to an exemplary aspect. The illustrated radio frequency module 540 also includes radio frequency (RF) circuitry (or radio frequency "RF" circuit) 543. In an exemplary aspect, the acoustic wave filters 544 may include one or more of filter 500 including XBARs (e.g., the bulk acoustic resonators described herein), as described above with respect to FIG. 5A.

The acoustic wave filter 544 shown in FIG. 5B includes terminals 545A and 545B (e.g., first and second terminals). The terminals 545A and 545B can serve, for example, as an input contact and an output contact for the acoustic wave filter 544. Although two terminals are illustrated, any suitable number of terminals can be implemented for a particular application. The acoustic wave filter 544 and the RF circuitry 543 are on a package substrate 546 (e.g., a common substrate) in FIG. 5B. The package substrate 546 can be a laminate substrate. The terminals 545A and 545B can be electrically connected to contacts 547A and 547B, respectively, on the package substrate 546 by way of electrical connectors 548A and 548B, respectively. The electrical connectors 548A and 548B can be bumps or wire bonds, for example. In an exemplary aspect, the acoustic wave filter 544 and the RF circuitry 543 may be enclosed together within a common package, with or without using the package substrate 546.

The RF circuitry 543 can include any suitable RF circuitry. For example, the RF circuitry can include one or more radio frequency amplifiers (e.g., one or more power amplifiers and/or one or more low noise amplifiers), one or more radio frequency switches, one or more additional RF filters, one or more RF couplers, one or more delay lines, one or more phase shifters, or any suitable combination thereof. The RF circuitry 543 can be electrically connected to the one or more acoustic wave filters 544. The radio frequency module 540 can include one or more packaging structures to, for example, provide protection and/or facilitate easier handling of the radio frequency module 540. Such a packaging structure can include an overmold structure formed over the package substrate 546. The overmold structure can encapsulate some or all of the components of the radio frequency module 540.

Figure 6A:
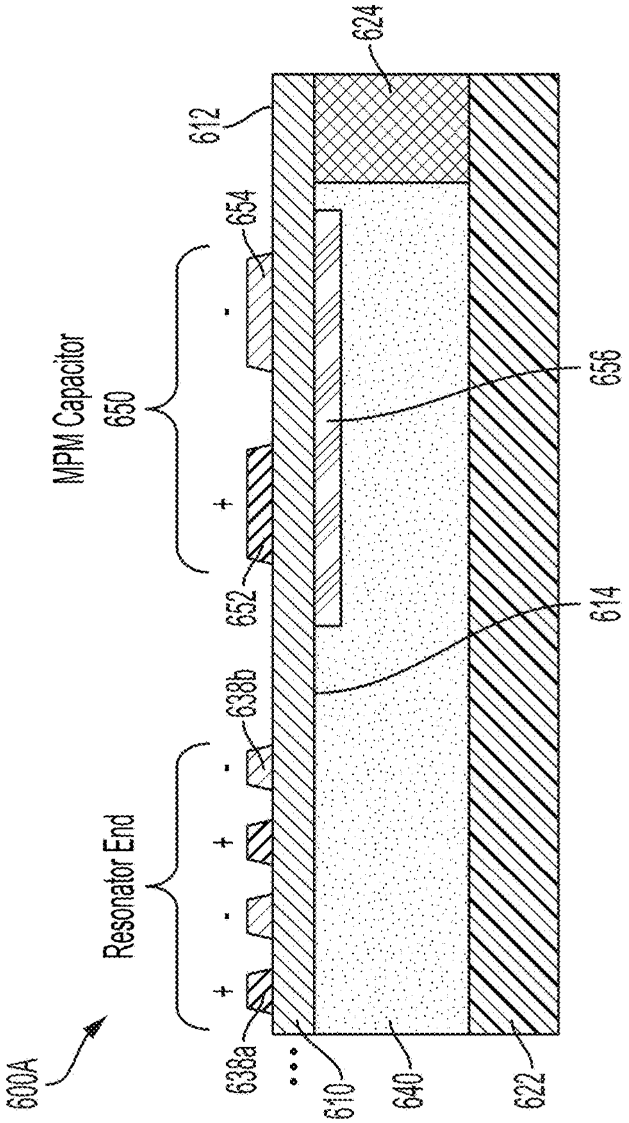
FIG. 6A is a schematic cross-sectional view of a portion of a filter device that includes an XBAR with a capacitor coupled in parallel to the resonator according to an exemplary aspect.

FIG. 6A is a schematic cross-sectional view of a portion of a filter device that includes an XBAR with a capacitor coupled in parallel to the resonator according to an exemplary aspect. In particular, the resonator structure 600A includes a metal-piezoelectric-metal ("MPM") capacitor 650, which is a capacitor coupled in parallel to the acoustic resonator that provides a high capacitance density while providing size reduction compared to conventional interdigitated capacitors (IDC) or metal-insulator-metal ("MIM") capacitor structures. In an exemplary aspect, the capacitor can be configured as a parallel plate capacitor, although it is also noted that the term "parallel" generally refers to two or more opposing metal plates forming the capacitor and that the surfaces of the respective metal plates are not necessarily planar and exactly parallel to each other. Instead, these plates of the capacitor may have minor variations due to manufacturing tolerances, for example.

In general, the coupling coefficient $K_{eff}$ of XBAR resonators greatly influences the bandwidth of the filter device that includes such XBAR resonators. Moreover, it is generally known that the introduction of passive components, such as IDC and MIM capacitor structures, in series or parallel can reduce the coupling coefficient $K_{eff}$ and the subsequent bandwidth of the filter device. However, the two conventional capacitive structures (i.e., the MIM and IDC structures) negatively impact the Q-factor of the filter device and largely increase the overall volume of the filter, making practical application difficult.

Figure 6B:
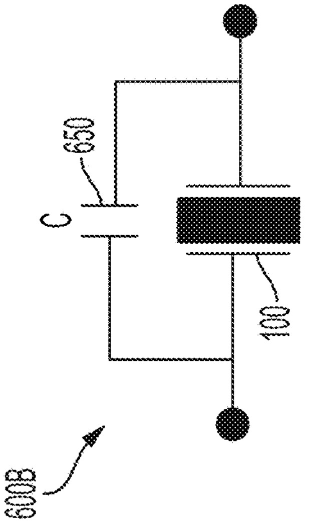
FIG. 6B is a circuit of the filter device illustrated in FIG. 6A according to an exemplary aspect.

To address these limitations, the resonator structure 600A of the exemplary aspect utilizes vertical electric field ("E-field") where metal electrodes are disposed on the opposing surfaces of the piezoelectric layer to create a capacitor 650 (e.g., a parallel plate capacitor), which can be referred to as an MPM structure or MPM capacitor for purposes of this disclosure. In general, FIG. 6B is a circuit 600B of the resonator structure 600A illustrated in FIG. 6A according to an exemplary aspect. As shown, the XBAR 100, such as any of the XBAR devices described above with respect to FIGS. 1 and 2A-2E, is coupled in parallel to capacitor 650. Effectively, the parallel plate MPM capacitor 650 can be realized to provide a higher capacitance density and size reduction compared to conventional IDC or MIM capacitor structures as will be described in detail below.

Referring back to FIG. 6A, the resonator structure 600A can generally correspond, for example, to the structure shown above in FIG. 1B in which a substrate (also referred to as a support substrate) includes a base 622 (e.g., silicon) and an intermediate layer 624 (e.g., silicon oxide or silicon dioxide) is disposed thereon. It should be appreciated that the base 622 and the intermediate layer 624 may be collectively considered the substrate in an exemplary aspect, for example as described above with respect to FIG. 3B. In either event, a piezoelectric layer 610 (e.g., lithium niobate or lithium tantalate) can be supported by the substrate 622, such as being coupled to the intermediate layer 624 where a cavity 640 is formed over the base 622 of the support substrate. It should be appreciated that the substrate 622 can correspond to substrate 120 and the intermediate layer 624 can correspond to intermediate layer 124 as described above. Moreover, the piezoelectric layer 610 can correspond to piezoelectric layer 110 as also described above.

As further shown, the piezoelectric layer 610 is disposed over the cavity 640 to form a diaphragm thereover as described above. The IDT can be disposed at one or both surfaces of the opposing sides of the piezoelectric layer 610. As generally described herein, the IDT can include a first busbar and a second busbar that each extend in a first direction from a first end to a second end thereof along the length of the diaphragm. Moreover, the IDT can include a first plurality of electrode fingers extending from the first busbar in a second direction towards the second busbar, with the second direction intersecting the first direction. In the example shown in FIG. 6A, IDT electrode fingers 638*a*, which can correspond to IDT fingers 238*a* described above, can extend from a first busbar (not shown). Similarly, the IDT can also include a second plurality of electrode fingers extending from the second busbar in the second direction towards the first busbar. The IDT electrode fingers 638*b*, which can correspond to IDT fingers 238*b* described above, can extend from the second busbar (not shown). According to this configuration, the first and second plurality of electrode fingers form the interleaved fingers of the IDT. In the example of FIG. 6A, only two first electrode fingers 638A (e.g., a positive potential) and two second electrode fingers 638*b* (e.g., a negative potential) are shown to represent the end of the resonator (e.g., XBAR 100) in the length direction across the diaphragm, but it is reiterated that the XBAR can have many (e.g., a plurality) of interleaved electrode fingers and is not so limited to only two pairs of fingers.

As further described above, an MPM capacitor structure 650 (also generally referred to as capacitor 650) is coupled in parallel to the resonator end of the XBAR 100. As shown, the capacitor 650 includes one or more first electrodes 652 and 654 on a first main surface 612 of the piezoelectric layer 610 and a metal layer 656 on a second main surface 614 of the piezoelectric layer 610, which opposes the first main surface 612 (i.e., the first and second surfaces 612 and 614 oppose each other). In the exemplary aspect, the first electrodes 652 and 654 correspond to a pair of electrodes including an anode 652 (e.g., a positive potential) and a cathode 654 (e.g., a negative potential) on the first main surface 612. Moreover, the metal layer 656 can be a floating metal disposed on the second main surface 614 of the piezoelectric layer 610. As a result, the piezoelectric layer 610 is sandwiched between the one or more first electrodes 652 and 654 of the capacitor 650 and the floating metal (i.e., the metal layer 656) of the capacitor 650, which effectively forms the MPM capacitor on the opposing surfaces of the piezoelectric layer 610 as described herein.

Thus, according to the exemplary aspect, the one or more first electrodes includes an anode 652 of the capacitor 650 that is coupled to the first busbar (not shown) and extends in parallel to the first plurality of electrode fingers (e.g., fingers 638*a*) of the resonator end. Moreover, the one or more first electrodes includes a cathode 654 of the capacitor 650 that is coupled to a second busbar (not shown) and extends in parallel to the second plurality of electrode fingers (e.g., fingers 638*b*) of the resonator end.

Figure 6C:
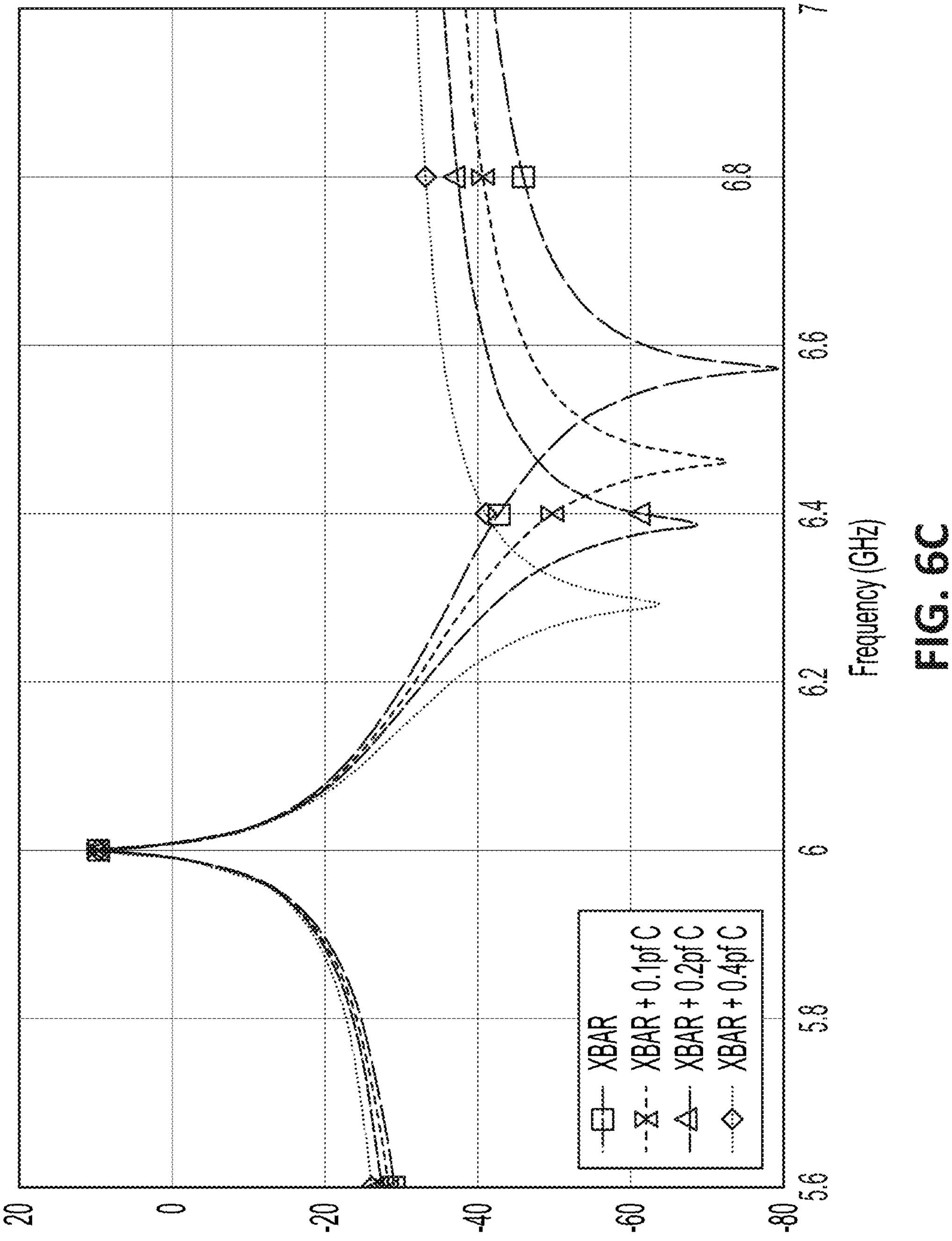
FIG. 6C is a chart of an admittance of XBAR devices as a function of frequency with an MPM capacitor couple thereto according to an exemplary aspect.

FIG. 6C is a chart of an admittance of XBAR devices as a function of frequency with an MPM capacitor coupled thereto according to an exemplary aspect. More particularly, chart 600C shows the admittance in dB as a function of frequency for the XBAR devices with MPM capacitor structures having different capacitances coupled thereto, which is simulated using finite element method (FEM) simulation techniques. As described above, the capacitor 650 is coupled in parallel with an XBAR resonator 100 to decrease the effective coupling of a resonator by shifting the anti-resonance (Fa) lower in frequency.

As shown, an XBAR acoustic resonator (e.g., XBAR 100) as described above with no parallel plate capacitor has an anti-resonance frequency (fa) at approximately 6.57 GHz. Coupling an MPM capacitor in parallel thereto at capacitance values of 0.1 pf C, 0.2 pf C and 0.4 pf C, for example, will shift the anti-resonance frequency (fa) downward (i.e., to the left), which effectively decreases the effective coupling. Doing so is important for XBAR devices operating in narrow passbands, such as n79 as described herein.

Figure 7A:
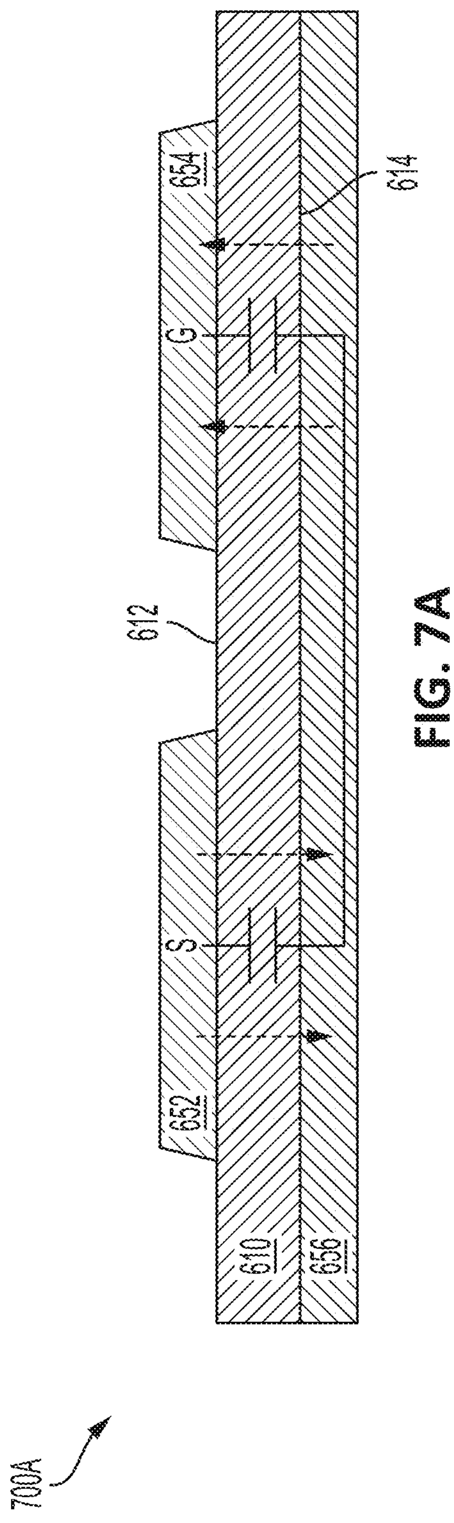
FIGS. 7A to 7C illustrate expanded schematic cross-sectional views of MPM capacitor structures according to exemplary aspects.
Figure 7B:
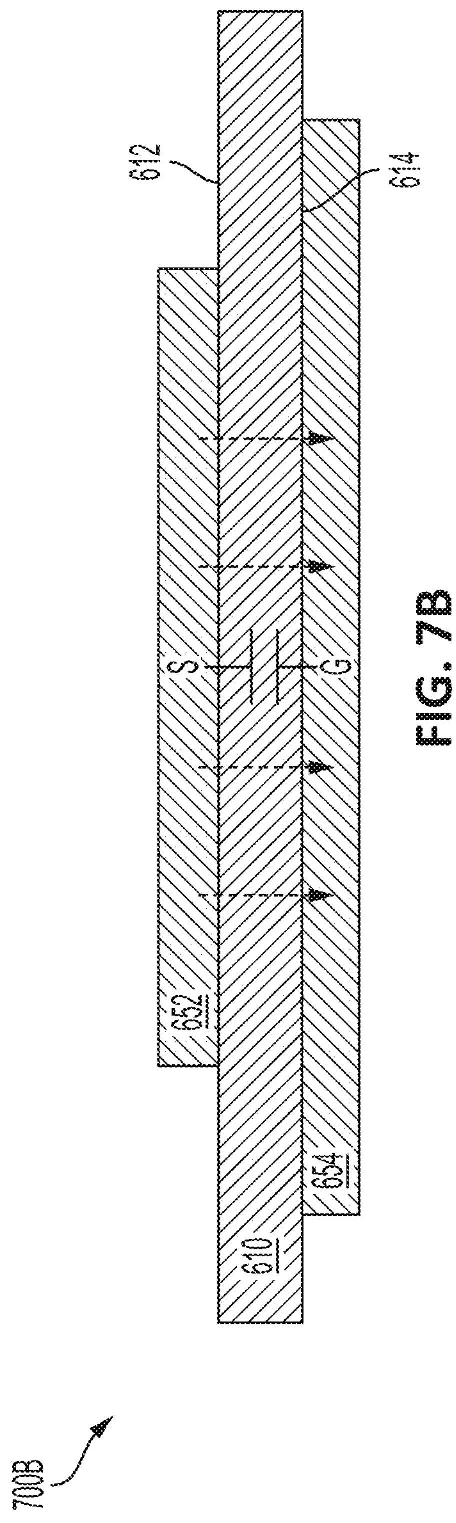
Figure 7C:
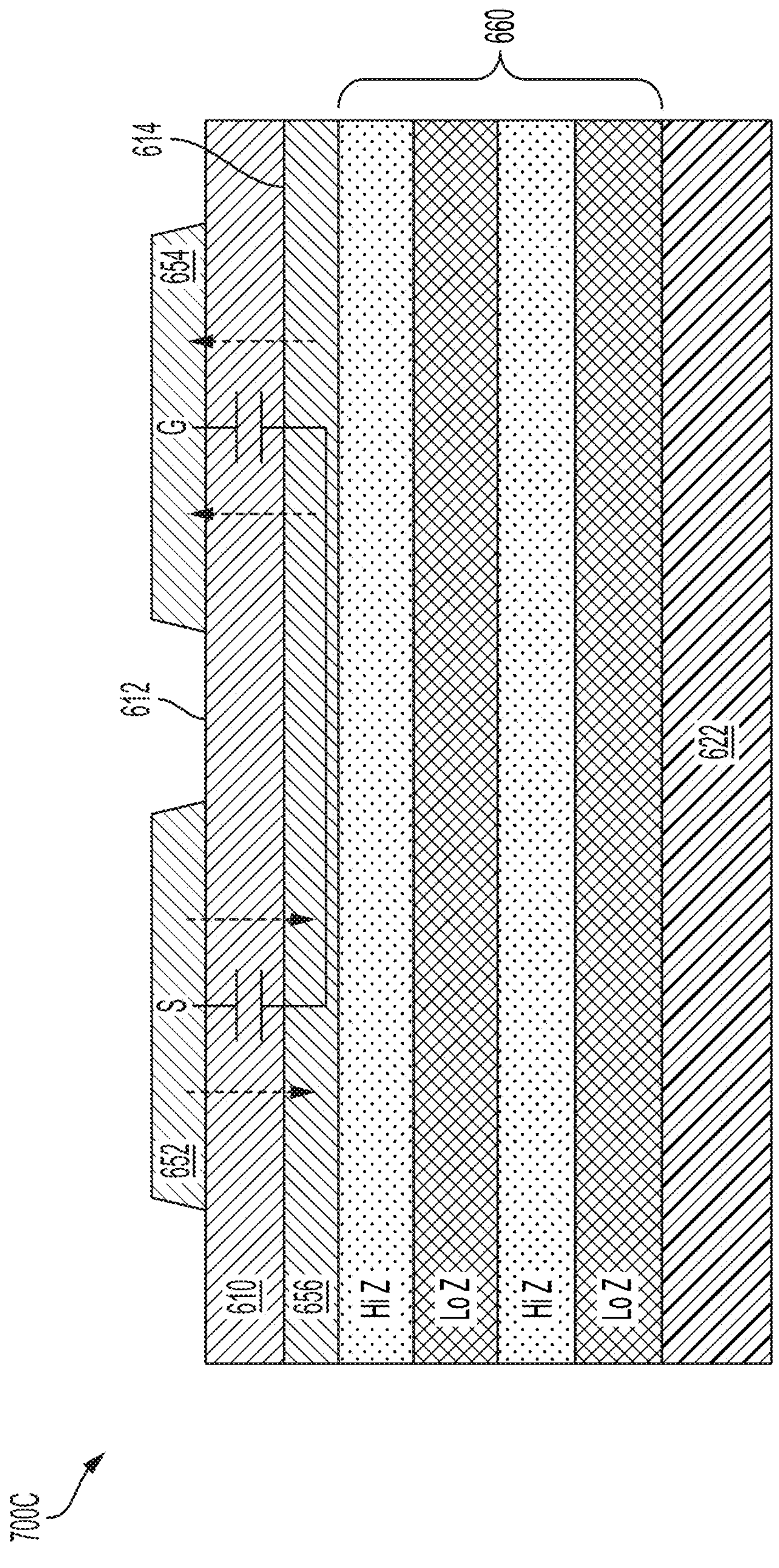

In general, the MPM capacitor structure 650 can be implemented according to various aspects and coupled in parallel to the XBAR resonator 100. FIGS. 7A to 7C illustrate expanded schematic cross-sectional view of an MPM capacitor structure according to exemplary aspects.

Specifically, FIG. 7A illustrates an MPM capacitor 700A that generally corresponds to the MPM capacitor structure 650 described above with respect to FIG. 6A. As shown, the capacitor 700A includes an anode 652 and cathode 654, which can generally correspond to the one or more first electrodes as described herein and are disposed on the first main surface 612 of the piezoelectric layer 610 and a metal layer 656 is disposed on a second main surface 614 of the piezoelectric layer 610, which opposes the first main surface 612. As shown, a first capacitance is formed across the piezoelectric layer 610 and between the anode 652 and the floating metal (i.e., metal layer 656) and a second capacitance is formed across the piezoelectric layer 610 and between the floating metal (i.e., metal layer 656) and the cathode 654. As a result, an electric field (E-field) flows from the positive potential (anode 652) to the negative potential (cathode 654) through metal layer 656.

FIG. 7B illustrates an MPM capacitor 700B according to another exemplary aspect. It should be appreciated that MPM capacitor 700B can replace the MPM capacitor structure 650 described above with respect to FIG. 6A. As shown, the capacitor 700B includes an anode 652 on the first main surface 612 of the piezoelectric layer 610 and a cathode 654 disposed on a second main surface 614 of the piezoelectric layer 610, which opposes the first main surface 612. As shown, a capacitance is formed in the vertical direction across the piezoelectric layer 610 and between the anode 652 and the cathode 654. As a result, an electric field (E-field) flows from the positive potential (anode 652) to the negative field (cathode 654) in the vertical direction.

FIG. 7C illustrates yet another MPM capacitor 700C according to another exemplary aspect. It should be appreciated that MPM capacitor 700C can replace the MPM capacitor structure 650 described above with respect to FIG. 6A. In this example, the MPM capacitor is coupled in parallel to an SM XBAR, such as the configuration shown in FIG. 2E and described above. As shown, the capacitor 700C includes an anode 652 and cathode 654, which can generally correspond to the one or more first electrodes as described herein and are disposed on the first main surface 612 of the piezoelectric layer 610 and a metal layer 656 is disposed on a second main surface 614 of the piezoelectric layer 610, which opposes the first main surface 612. As further shown, the metal layer 656 is disposed on a Bragg reflector or Bragg mirror 660. In this aspect, the Bragg reflector 660 can be disposed on a support substrate, such as the base 622 (e.g., silicon), and can correspond to the acoustic Bragg reflector 240 described above with respect to FIG. 2E. As such, Bragg reflector 660 can include multiple dielectric layers that alternate between materials having high acoustic impedance and materials having low acoustic impedance. As noted above, the terms "high" and "low" are relative terms, such that, for each layer, the standard for comparison is the adjacent layers. Each "high" acoustic impedance layer has an acoustic impedance higher than that of both the adjacent low acoustic impedance layers. Each "low" acoustic impedance layer has an acoustic impedance lower than that of both the adjacent high acoustic impedance layers.

According to the exemplary aspect shown in FIG. 7C, a first capacitance of capacitor structure 700C is formed across the piezoelectric layer 610 and between the anode 652 and the floating metal (i.e., metal layer 656) and a second capacitance is formed across the piezoelectric layer 610 and between the floating metal (i.e., metal layer 656) and the cathode 654. As a result, an electric field (E-field) flows from the positive potential (anode 652) to the negative field (cathode 654) through metal layer 656.

Figure 7D:
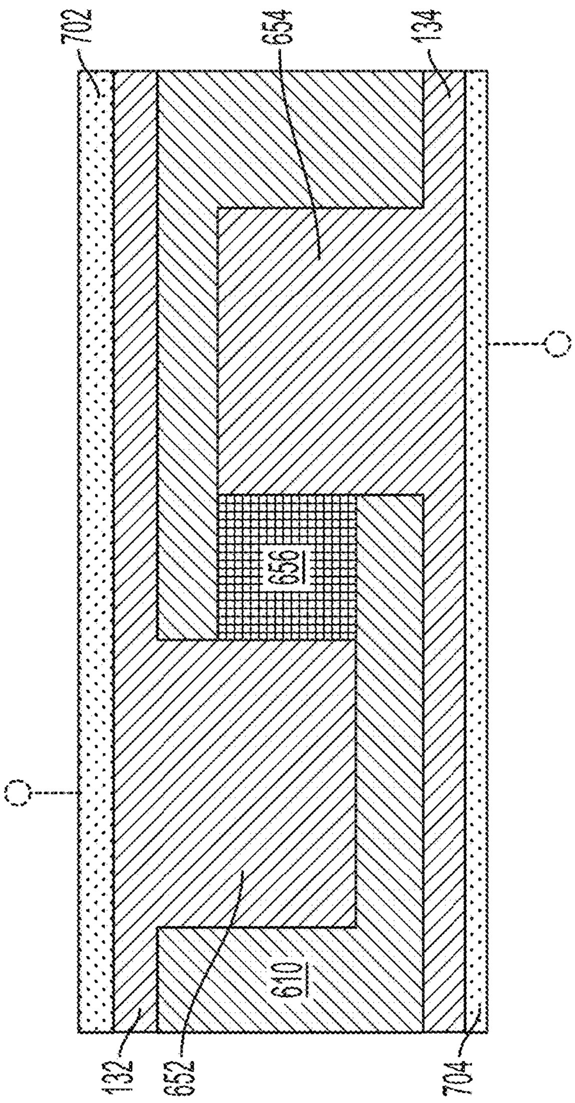
FIGS. 7D to 7E illustrate expanded schematic top views of MPM capacitor structures according to exemplary aspects.
Figure 7E:
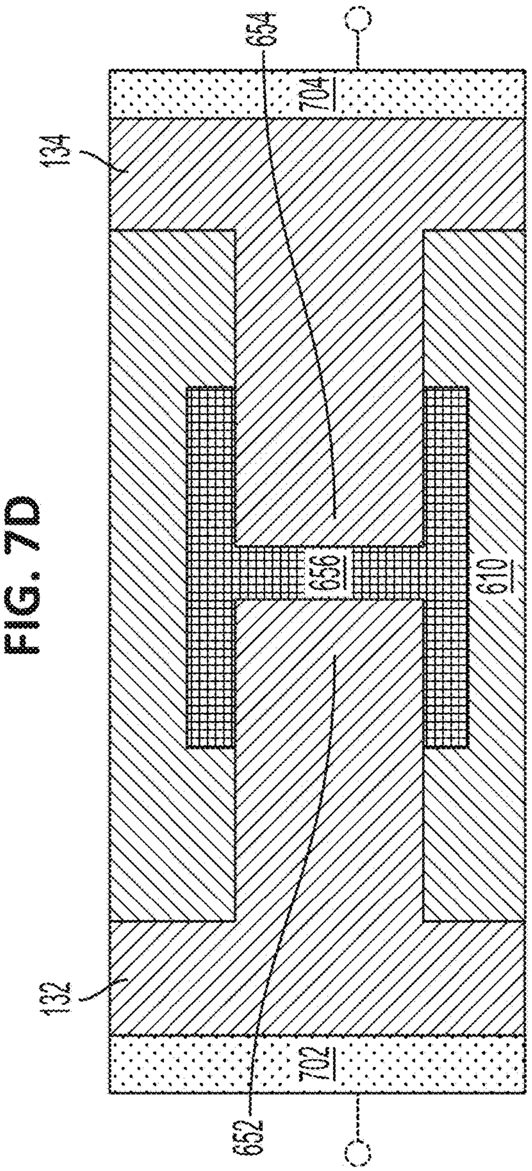

FIGS. 7D to 7E illustrate expanded schematic top views of MPM capacitor structures according to exemplary aspects. In particular, the top views shown illustrate alternative exemplary aspects of either capacitor structure 700A and/or 700C that each comprise an anode 652 and a cathode 654 on a first main surface (e.g., a top surface) of the piezoelectric layer 610. Moreover, the floating metal layer 656 is disposed on a second main surface. In each embodiment shown in FIGS. 7D and 7E, the anode 652 and cathode 654 are coupled to respective busbars 132 and 134 of the IDT conductor pattern as described above with respect to FIG. 1A. Thus, as also described above, anode 652 will extend in a parallel direction as the first electrode fingers extending from busbar 132 and cathode 654 will extend in a parallel direction as the second electrode fingers extending from busbar 134.

In each embodiment, anode 652 and cathode 654 extend towards each other. However, in the embodiment of FIG. 7D, the anode 652 and cathode 654 are disposed in an offset and asymmetric configuration from each other, but they overlap each other in the length direction of the IDT. In contrast, in the embodiment of FIG. 7E, the anode 652 and cathode 654 extend directly towards each other in a symmetric configuration and with a gap therebetween. It should be appreciated that in each embodiment, the metal layer 656 overlaps (at least partially) both the anode 652 and cathode 654 in the thickness direction of the capacitor structure so as to sandwich the piezoelectric layer 610 and create the MPM capacitor structure described above. Moreover, metal traces 702 and 704 can be provided and electrically coupled to the respective busbars 132 and 134 so as to generate the positive and negative potentials, and thus the electric field, between the capacitor plates.

Figure 7F:
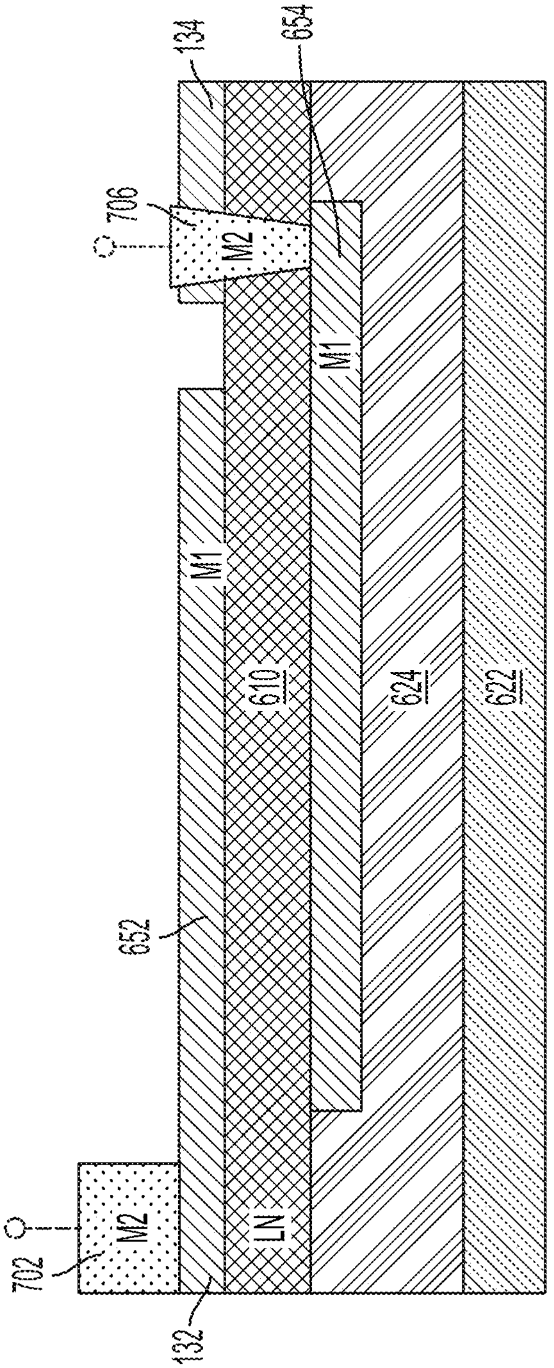
FIG. 7F illustrates an expanded schematic cross-sectional view of an MPM capacitor structures according to an exemplary aspect.
Figure 7G:
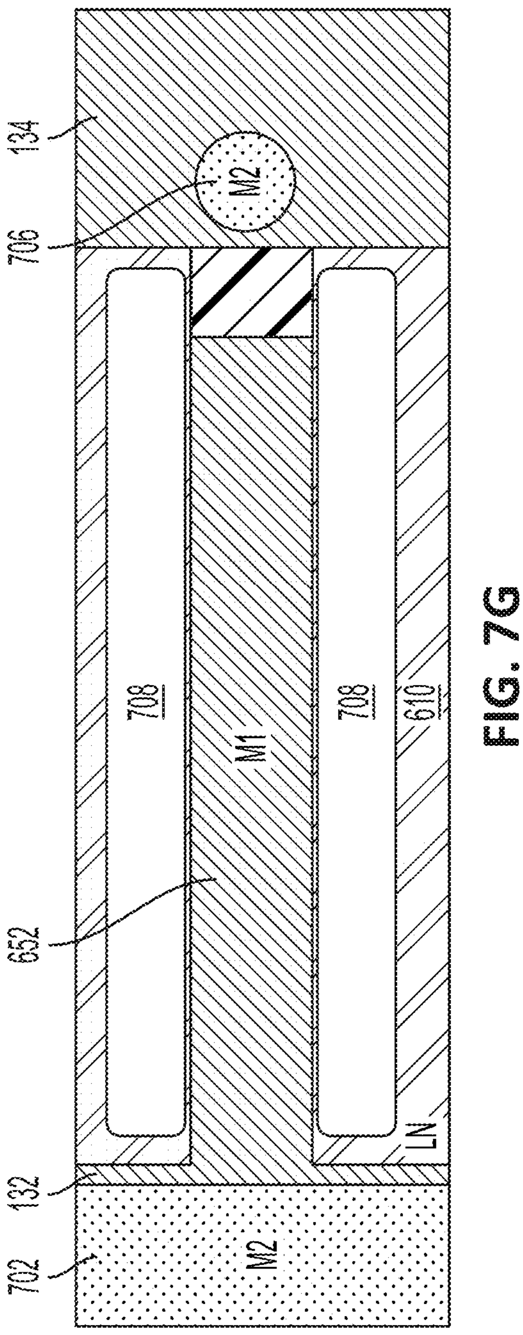
FIG. 7G illustrates an expanded schematic top view of an MPM capacitor structures according to an exemplary aspect.

FIG. 7F illustrates an expanded schematic cross-sectional view of an MPM capacitor structures according to an exemplary aspect. Moreover, FIG. 7G illustrates an expanded schematic top view of an MPM capacitor structures according to an exemplary aspect. In particular, the views shown in FIGS. 7F and 7G can illustrate an exemplary aspect of the capacitor structure 700B described above, which comprises an anode 652 (e.g., metal M1) on a first main surface of the piezoelectric layer 610 and a cathode 654 e.g., metal M1) on a second main surface of the piezoelectric layer 610. In this embodiment, the anode 652 is (electrically) coupled to busbar 132 and cathode 654 is (electrically) coupled to busbar 134 of the IDT conductor pattern as described above with respect to FIG. 1A.

Moreover, a metal via 706 (e.g., filled with a conductive metal M2, such as aluminum) extends through the piezoelectric layer 610 to couple busbar 134 to the cathode 654 disposed on the lower surface of the piezoelectric layer 610. The metal trace 702 (also denoted as M2) and conductive via 706 (or a trace coupled thereto) can be configured as the capacitor terminals that are coupled to the anode 652 and cathode 654, respectively. In an exemplary embodiment, through holes 708 can be etched or otherwise provided in the piezoelectric layer 610 on each side of the anode 652 and cathode 654 in the thickness direction (e.g., vertical direction) of the piezoelectric layer 610. In this aspect, the through holes 708 provide a defined area of capacitance where the electric field is confined within the electrode area of the capacitor, electrical isolation of the MPM capacitor structure from neighboring structures, and acoustic isolation from neighboring structures.

Figure 8A:
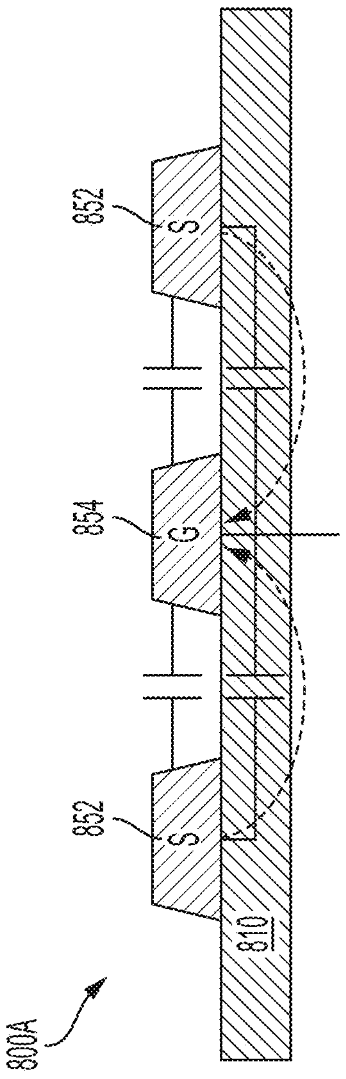
FIGS. 8A and 8B illustrate conventional interdigitated capacitor (IDC) structures.
Figure 8B:
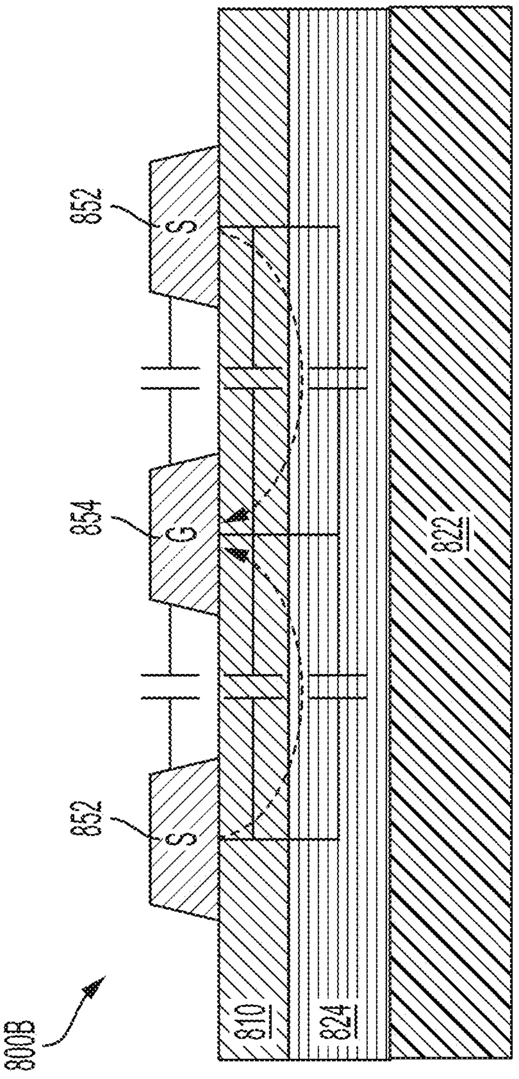

FIGS. 8A and 8B illustrate conventional interdigitated capacitor (IDC) structures. More particularly, FIG. 8A illustrates a released structure 800A (e.g., on a diaphragm suspended over a cavity) of an IDC structure. FIG. 8B illustrates an unreleased structure 800B (e.g., substrate and/or dielectric layer) of an IDC structure. In either case a pair of positive potential electrodes 852 are each capacitively coupled to a negative potential electrode 854. The pair of electrodes 852 and electrode 854 are disposed on a piezoelectric plate 810 and the electric field (i.e., E-field) flows from the pair of electrodes 852 to electrode 854. In addition, the unreleased structure of FIG. 8B includes a dielectric layer 824 (e.g., silicon dioxide) and a support substrate 822 (e.g., silicon) that support the capacitor structure.

Figure 8C:
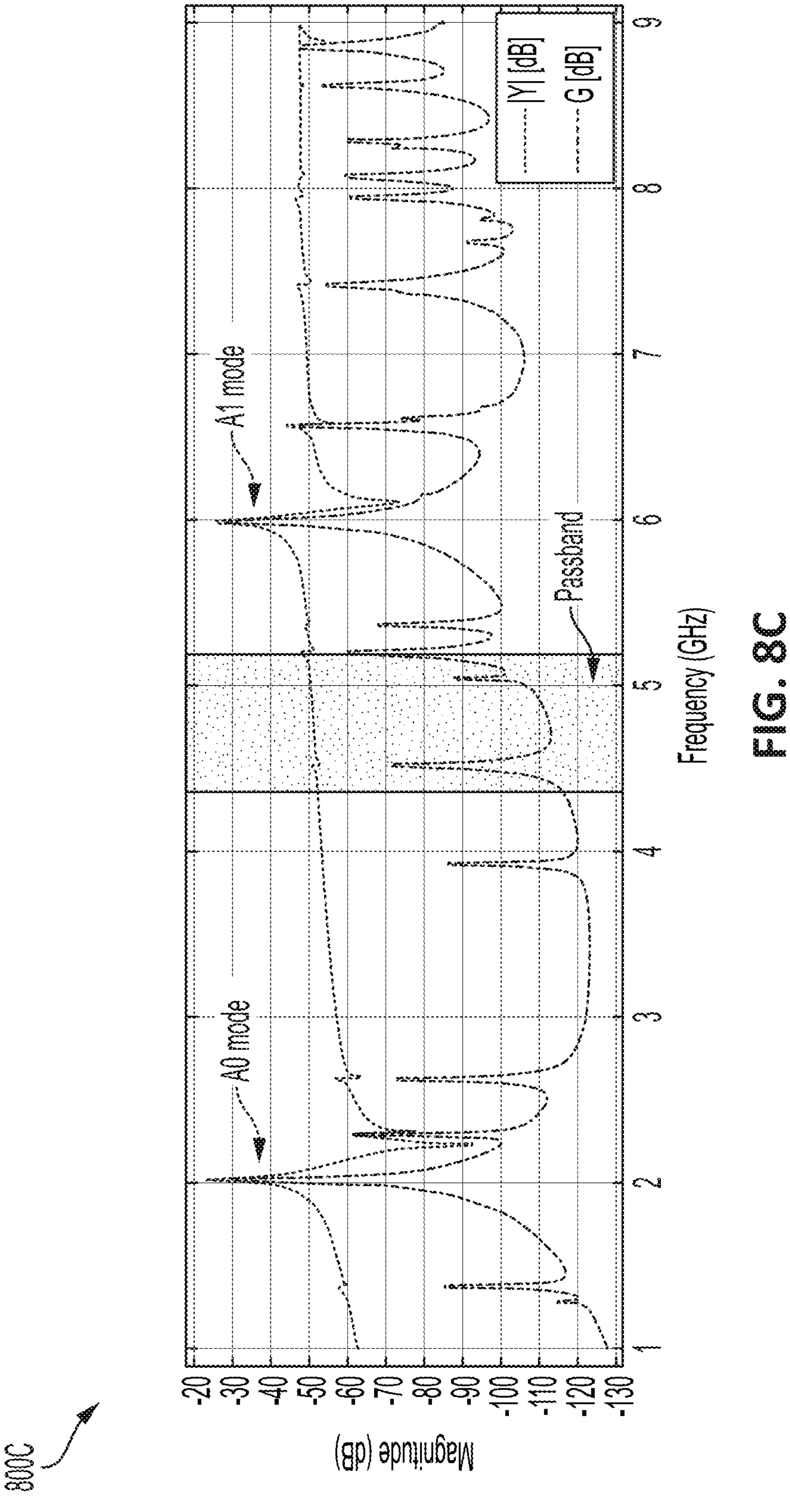
FIGS. 8C and 8D are charts of an admittance as a function of frequency of the IDC structures illustrated in FIGS. 8A and 8B.
Figure 8D:
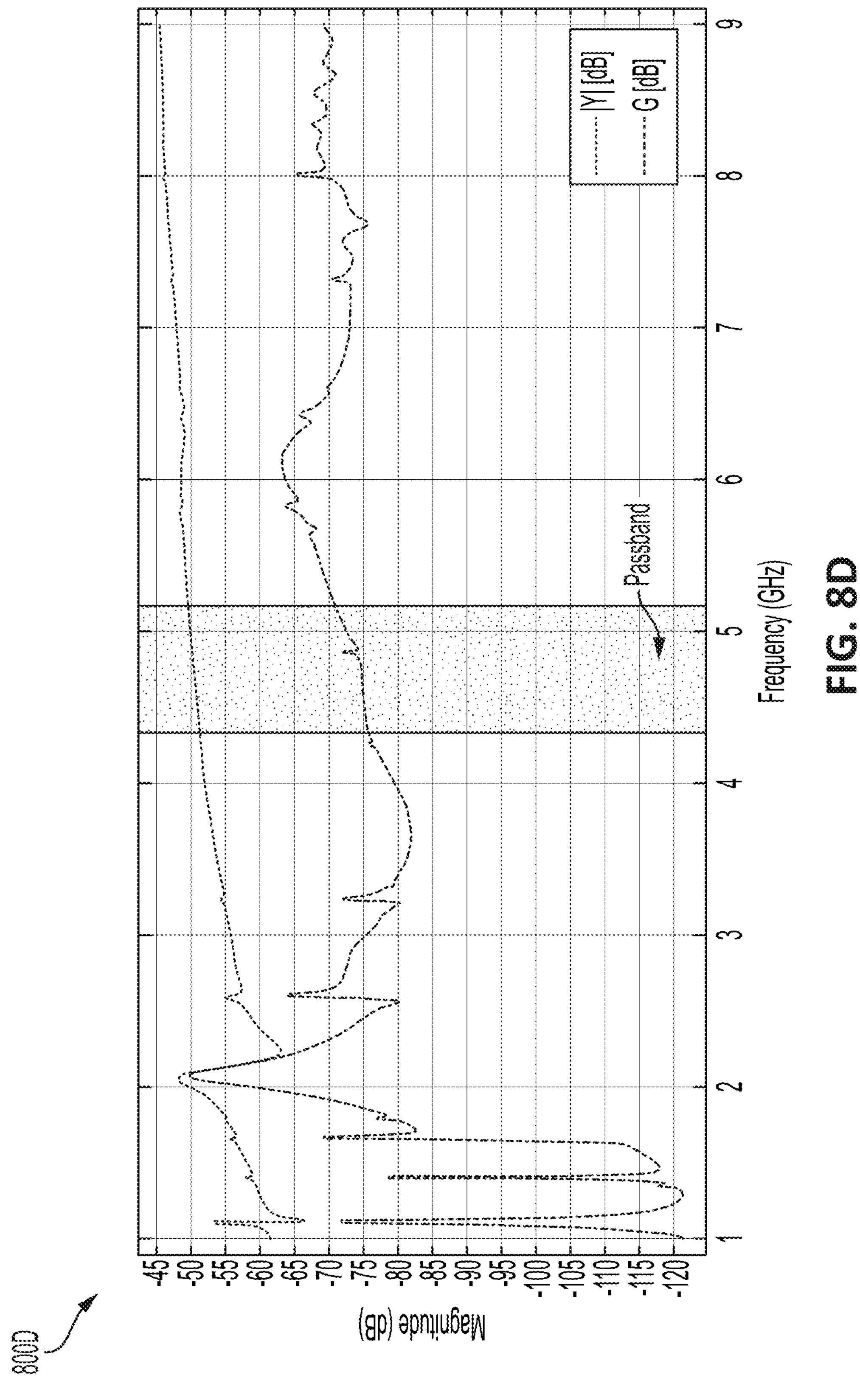

FIGS. 8C and 8D are charts of an admittance as a function of frequency of the IDC structures shown in FIGS. 8A and 8B, respectively. In particular, plot 800C illustrates a chart of admittance of released structure 800A and plot 800D illustrates a chart of admittance of unreleased structure 800B.

In general, capacitive density (Ca) is a function of thickness and permittivity of the insulating material.

$$C = \frac{\varepsilon_0 \varepsilon_r A}{t} \quad \frac{dC}{dt} = \frac{-\varepsilon_0 \varepsilon_r A}{t^2} \quad C_d = \frac{C}{A} = \frac{\varepsilon_0 \varepsilon_r}{t}$$

Moreover, capacitive sensitivity to thickness variation of insulating material is $dC=-dt/t^2$. For the IDC structures, such as structures 800A and 800B, the capacitive density ($C_d$) will be a function of pitch, which is spacing between the capacitor electrodes and the thickness of each layer. Accordingly, as shown in the charts of FIGS. 8C and 8D, the lateral field will limit the capacitance density. As a result, both configurations present a poor capacitor performance and significant acoustic activity (e.g., spurious activity) at frequencies near the passband of the acoustic frequency, although it is noted that the unreleased structure in FIG. 8B can suppress some of the acoustic activity near passband.

FIGS. 9A, 9C, 9E, 9G and 9I illustrate expanded schematic cross-sectional views of MPM capacitor structures according to exemplary aspects. FIGS. 9B, 9D, 9F and 9H are charts of an admittance as a function of frequency of the MPM IDC capacitor structures illustrated in FIGS. 9A, 9C, 9E and 9G, respectively. It is noted that the reference numbers used above with regard to the exemplary embodiments are common to the features shown in FIGS. 9A, 9C, 9E and 9G and will not be described in detail below.

Figure 9A:
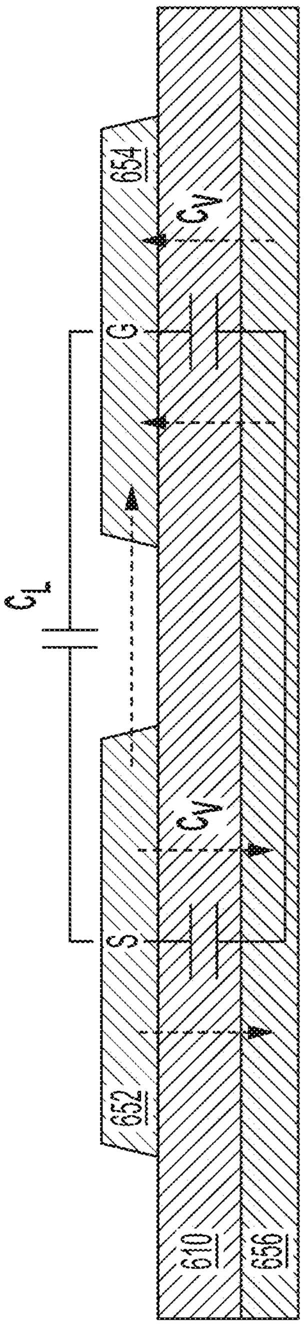
FIGS. 9A, 9C, 9E, 9G and 9I illustrate expanded schematic cross-sectional views of MPM capacitor structures according to exemplary aspects.

In the exemplary aspect, FIG. 9A illustrates a released structure (e.g., on a diaphragm suspended over a cavity) of an MPM structure according to an exemplary embodiment. In this example, the capacitance total $C_{total}$ is equal to $C_L$ (linear capacitance) plus $C_v$ vertical capacitance) divided by two. That is $C_{total}=C_L+C_v/2$. The capacitance density is $C_d=182$ [pF/mm$^2$].

Figure 9B:
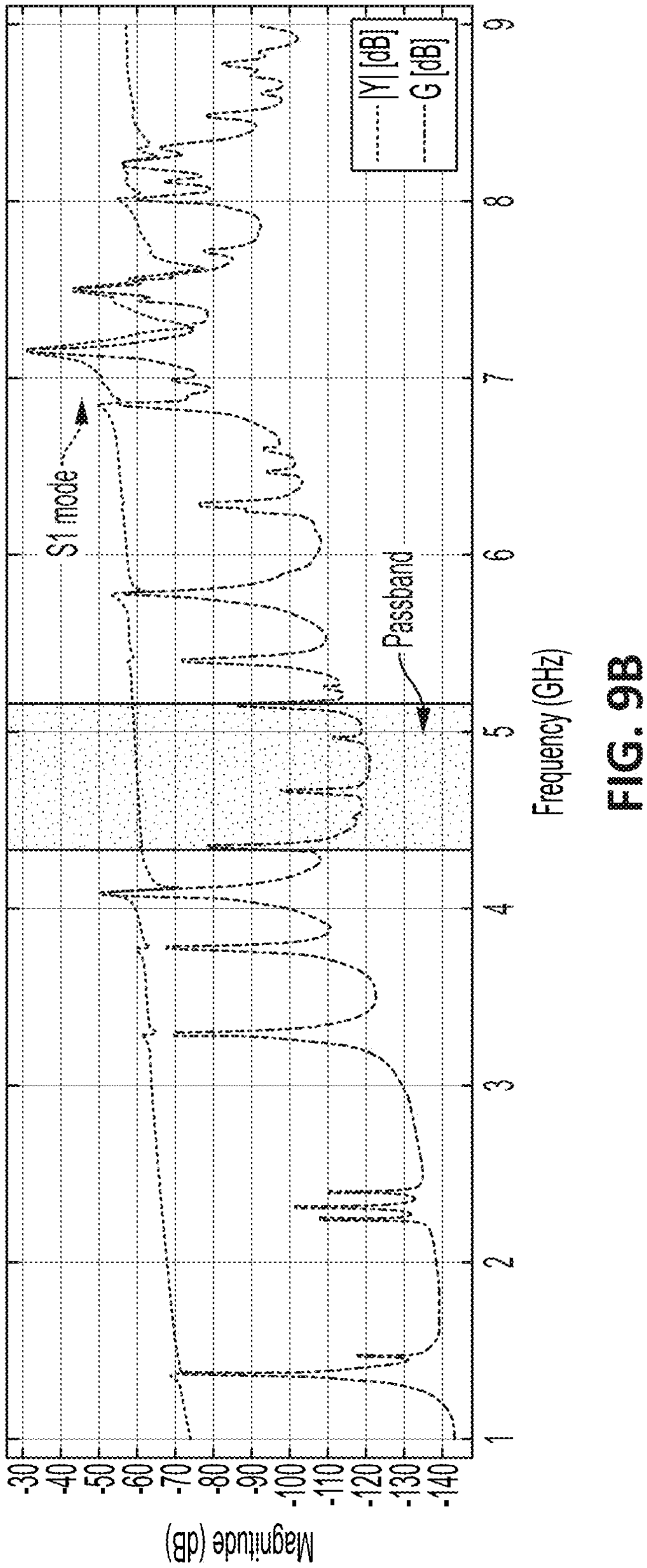
FIGS. 9B, 9D, 9F and 9H are charts of an admittance as a function of frequency of the MPM IDC capacitor structures illustrated in FIGS. 9A, 9C, 9E and 9G, respectively.

FIG. 9B illustrates a chart showing the admittance in dB as a function of frequency for the XBAR device that is coupled in parallel to an MPM capacitor structure as shown in FIG. 9A, which is simulated using finite element method (FEM) simulation techniques. The simulation parameters were a piezoelectric plate having a height of 350 nm, aluminum fingers having a height of 100 nm and mark (e.g., width) of 1.99 μm, a pitch of 4 μm and Euler Angles of the piezoelectric plate being [0, 30°, 0]. As illustrated, compared with the charts in FIGS. 8C and 8D, the exemplary MPM capacitor structure provides for higher capacitor performance and reduced acoustic activity (e.g., spurious activity) at frequencies near the passband of the acoustic frequency.

Figure 9C:
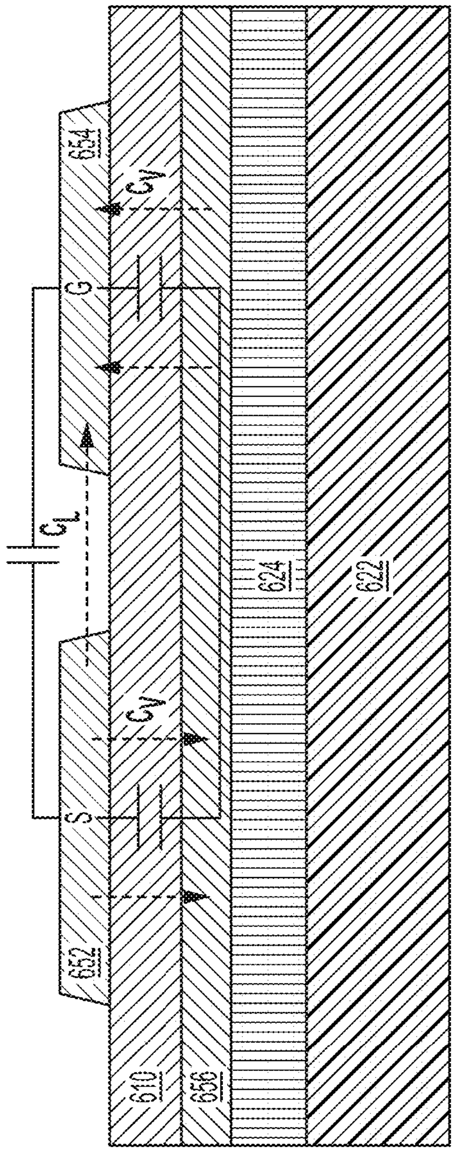
Figure 9D:
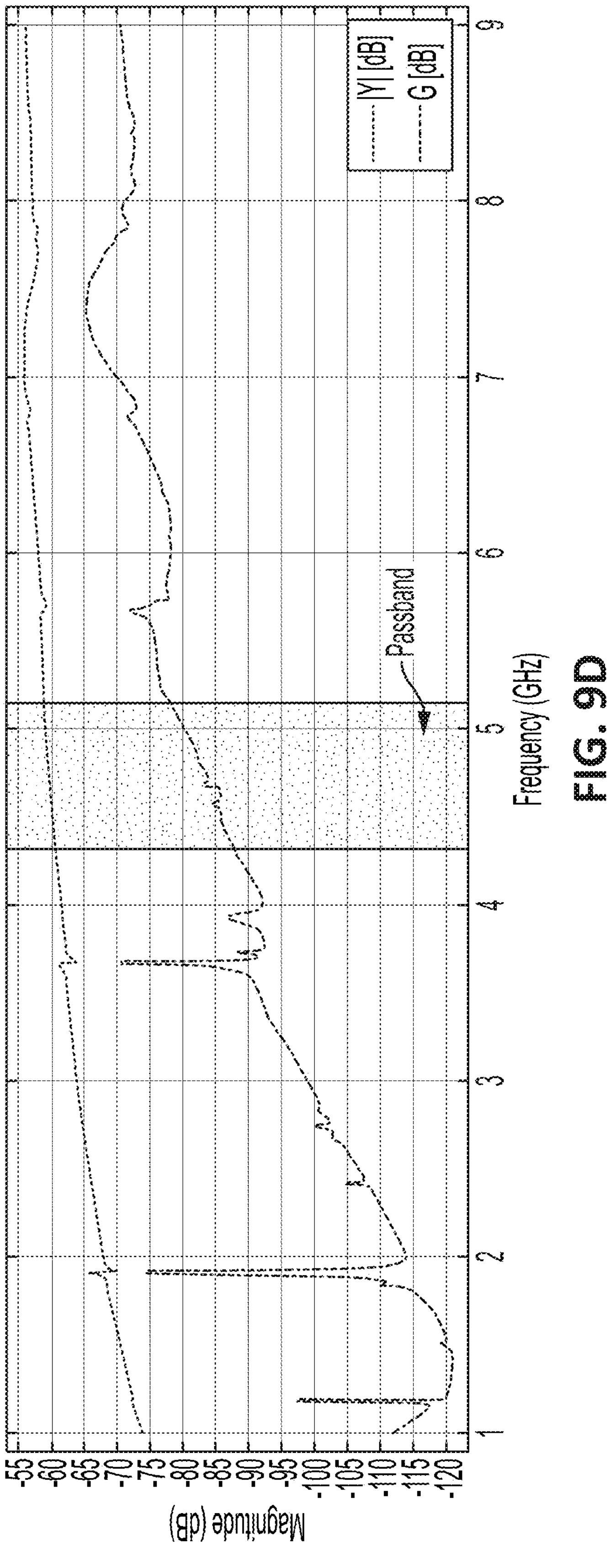

FIG. 9C illustrates a similar configuration as shown in FIG. 9A except as an unreleased structure, such that the MPM capacitor structure is coupled to a dielectric layer 624 (e.g., silicon oxide or silicon dioxide) on a support structure, such as the base 622 (e.g., silicon). Again the capacitance total is $C_{total}=C_L+C_v/2$ and the capacitance density is $C_d=182$ [pF/mm$^2$]. Using the same simulation parameters above, the plot shown in FIG. 9D illustrates that the unreleased structure is configured to suppress and/or dampen most of the acoustic activity near the passband. In addition, other parameters including pitch, mark, IDT thickness and piezoelectric thickness can be varied in alternative exemplary aspects to mitigate spurs.

Figure 9E:
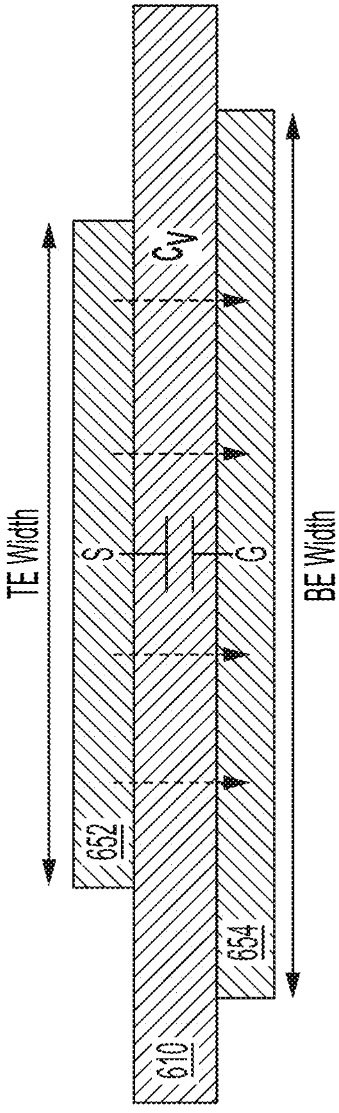
Figure 9F:
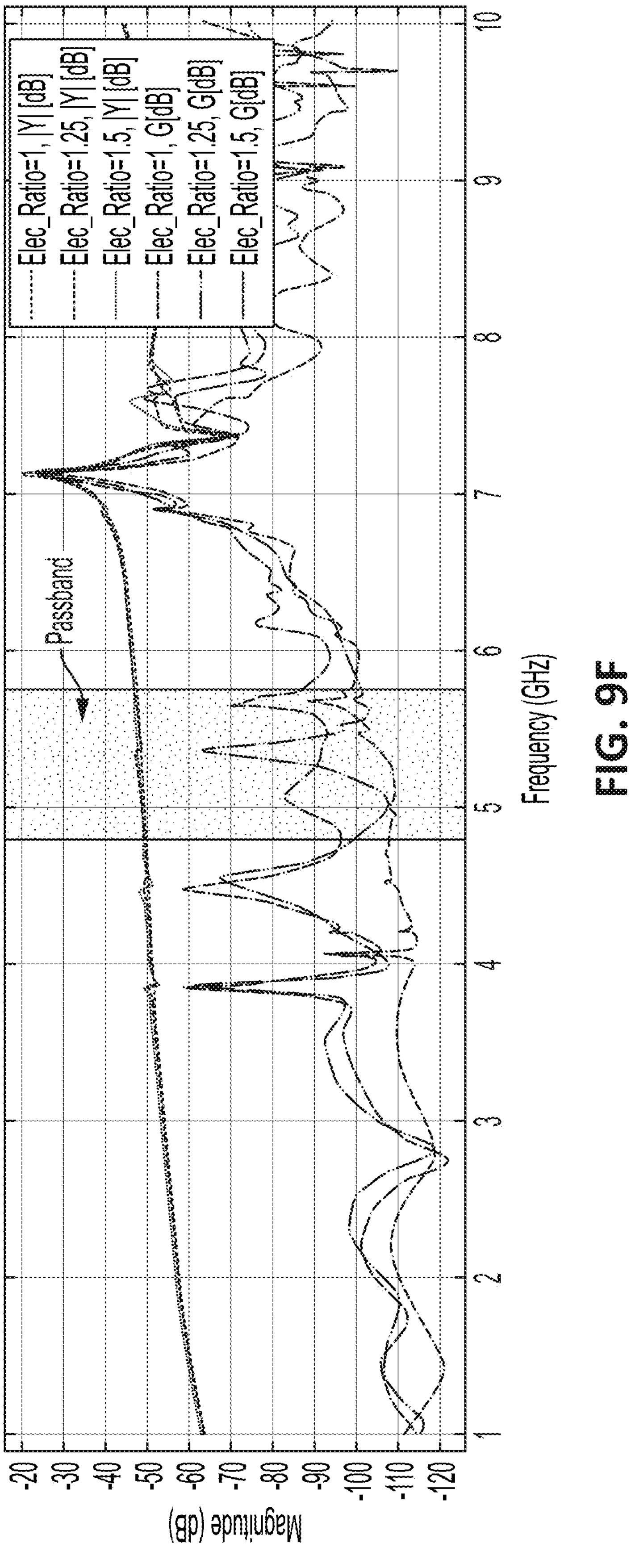
Figure 9G:
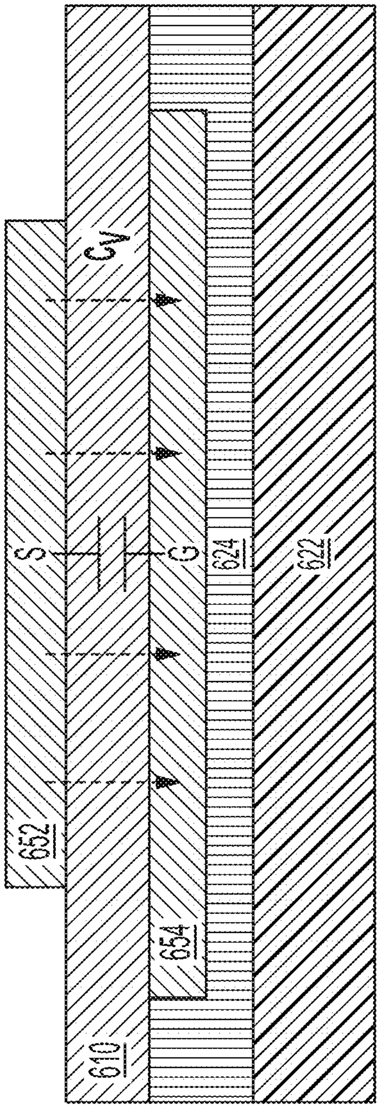

FIGS. 9E and 9G illustrate released (FIG. 9E) and unreleased (FIG. 9G) MPM capacitors as described herein in which an anode 652 is disposed on a first (or top) surface of the piezoelectric layer 610 and a cathode 654 is disposed on a second (or bottom) surface of the piezoelectric layer 610. As further shown, the E-field flows in the vertical direction from the anode 652 to the cathode 654. As further shown, the anode 652 has a TE (top electrode) width in the horizontal direction, i.e., parallel to the top surface of the piezoelectric layer 610. Similarly, the cathode 654 has a BE (bottom electrode) width in the horizontal direction, i.e., parallel to the bottom top surface of the piezoelectric layer 610.

Figure 9H:
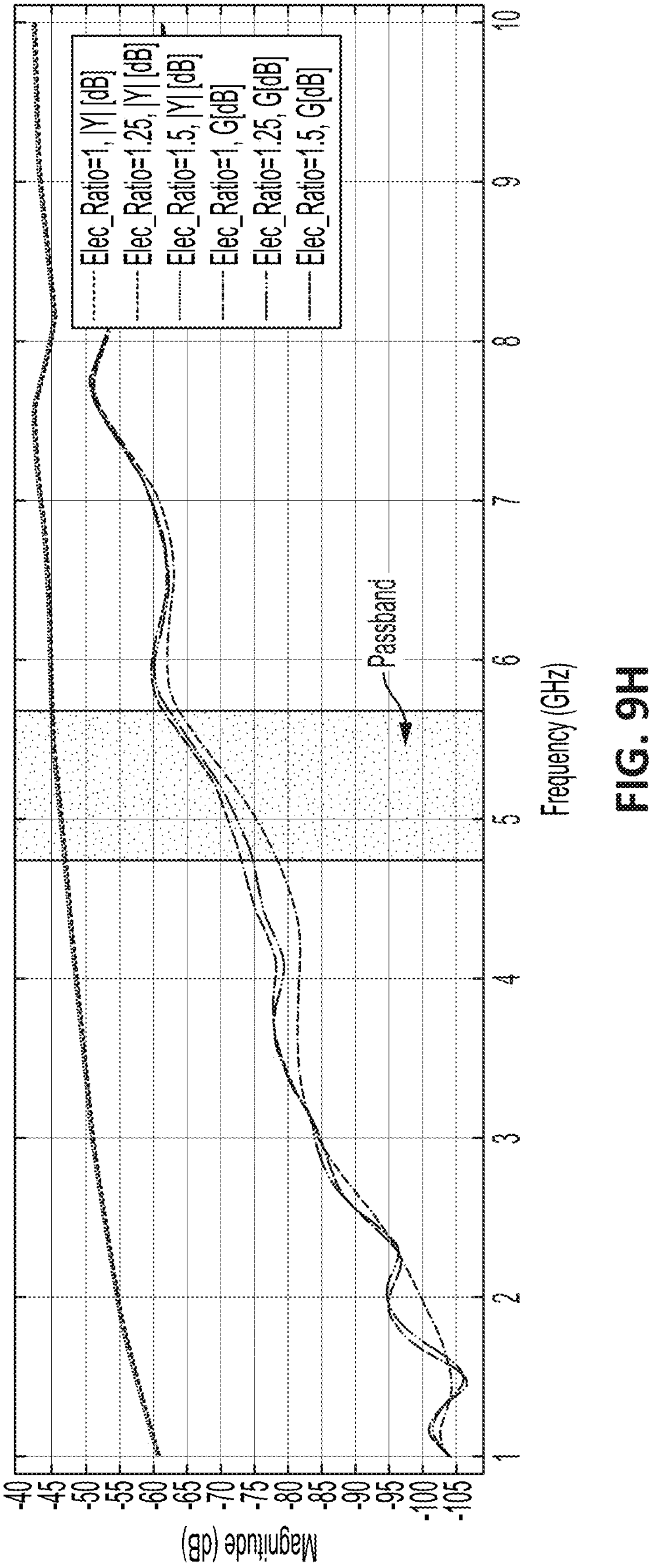

In the exemplary aspects shown in FIGS. 9E and 9G, the capacitance density is $C_d=990$ [pF/mm$^2$]. In this aspect, the large capacity density is achieved due to the vertical electric field (E-field). Moreover, the electrode ratio (Elect_Ratio) is defined as the BE (bottom electrode width) over TE (top electrode width). FIGS. 9F and 9H illustrate the admittance for both the released structure (FIG. 9E) and unreleased structure (FIG. 9G) at different electrode ratios. The simulation parameters for these charts were a piezoelectric plate having a height of 350 nm, aluminum fingers having a height of 100 nm and mark (e.g., width) of 0.6 μm. It is noted that significant acoustic activity will be observed when the top/bottom electrodes do not align. Moreover, the plot shown in FIG. 9G illustrates that the unreleased structure is configured to suppress and/or dampen most of the acoustic activity near the passband. As noted above, other parameters including pitch, mark, IDT thickness and piezoelectric thickness can be varied in alternative exemplary aspects to mitigate spurs.

Figure 9I:
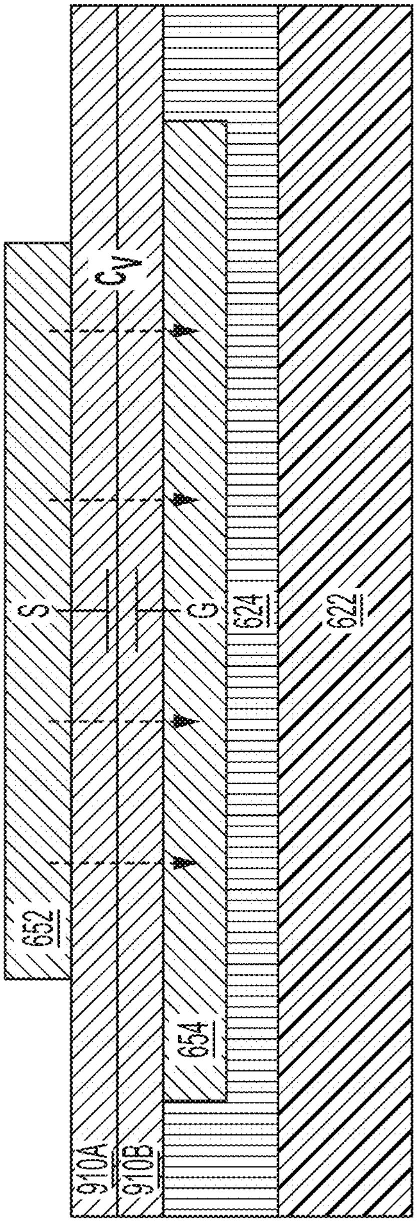

FIG. 9I illustrates a refinement of the exemplary aspect shown in FIG. 9A and also generally FIG. 6A described above. The embodiment of FIG. 9I generally includes the same components as described above except that the piezoelectric layer is a multi-layer complementarily oriented piezoelectric ("COP") structure that can include a dielectric coating to achieve high coupling for higher order modes, such as the A3 mode.

According to this exemplary aspect, the COP structure can include a bonding of piezoelectric materials (e.g., layers or plates) with complementary cuts. These cuts have a crystallographic orientation with respect to each other such that the corresponding piezoelectric tensor has opposite polarity within the additional one or more COP layers. Although the exemplary aspect contemplates a COP structure with two piezoelectric layers 910A and 910B, it is noted that the number of piezoelectric layers within the COP structure is not limited to two layers in alternative aspects. In particular, the number of piezoelectric layers can be determined based on mode order and the required coupling k2.

FIG. 9I is a schematic cross-sectional view of an acoustic wave resonator with a complementarily oriented piezoelectric structure according to an exemplary aspect. As shown, a pair of piezoelectric layers 910A and 910B (e.g., piezoelectric plate) is provided. In an exemplary aspect, a first piezoelectric layer (e.g., piezoelectric layer 910A, which can be considered a COP layer) is formed of and includes a material (e.g., lithium niobate or lithium tantalate) with a first cut having a first crystallographic orientation. Moreover, a second piezoelectric layer (e.g., piezoelectric layer 910B, which can be considered a standard layer) is coupled to the first piezoelectric layer (e.g., piezoelectric layer 910A) and is formed of and includes a material (e.g., lithium niobate or lithium tantalate) with a second cut having a second crystallographic orientation. The first and second cuts are configured such that a piezoelectric tensor of the second piezoelectric layer 910B is an opposite polarity to a piezoelectric tensor of the first piezoelectric layer 910A to increase coupling k2 of the resonator. In a similar embodiment as described above, a first electrode 652 and a second electrode 654 can correspond to a pair of electrodes including an anode 652 (e.g., a positive potential) and a cathode 654 (e.g., a negative potential) and can be disposed on opposing sides of the COP structure that includes the first and second piezoelectric layers 910A and 910B.

Advantageously, this COP structure provides a configuration in which an MPM capacitor can be configured without negating any benefits that might occur related to the use of a COP structure in the resonator, such as when the COP structure is used for higher order modes for the resonator.

In an exemplary aspect, the piezoelectric layers 910A and 910B may be, for example, a lithium niobate (LN) plate or a lithium tantalate (LT) plate. The crystal structure of LN and LT belongs to the 3m point group in that it exhibits three-fold rotation symmetry about the c-axis, commonly defined as the Z-axis. Moreover, the crystal structures of the 3m point group exhibit single-fold symmetry about the a/b-axis, commonly defined as the X/Y-axis. The materials (e.g., LN or LT) of the different piezoelectric layers 910A and 910B will have different Euler angles to define a cut of the material. For example, the Euler angle may be [0°, β, 0°], which may be referred to as a "Y-cut", where the "cut angle" is the angle between the y axis and the normal to the plate. The "cut angle" is equal to β+90°. For example, a plate with Euler angles [0°, 30°, 0°] is commonly referred to as "120° rotated Y-cut". Thus, in an exemplary aspect, a material of the first piezoelectric layer 910A can be a 60° rotated Y-cut lithium tantalate and the material of a second piezoelectric layer 910B can be 120° rotated Y-cut lithium tantalate. Effectively, these cuts are oriented so that the corresponding piezoelectric tensor has opposite polarity within additional COP layer (e.g., piezoelectric layer 910A).

Figure 10:
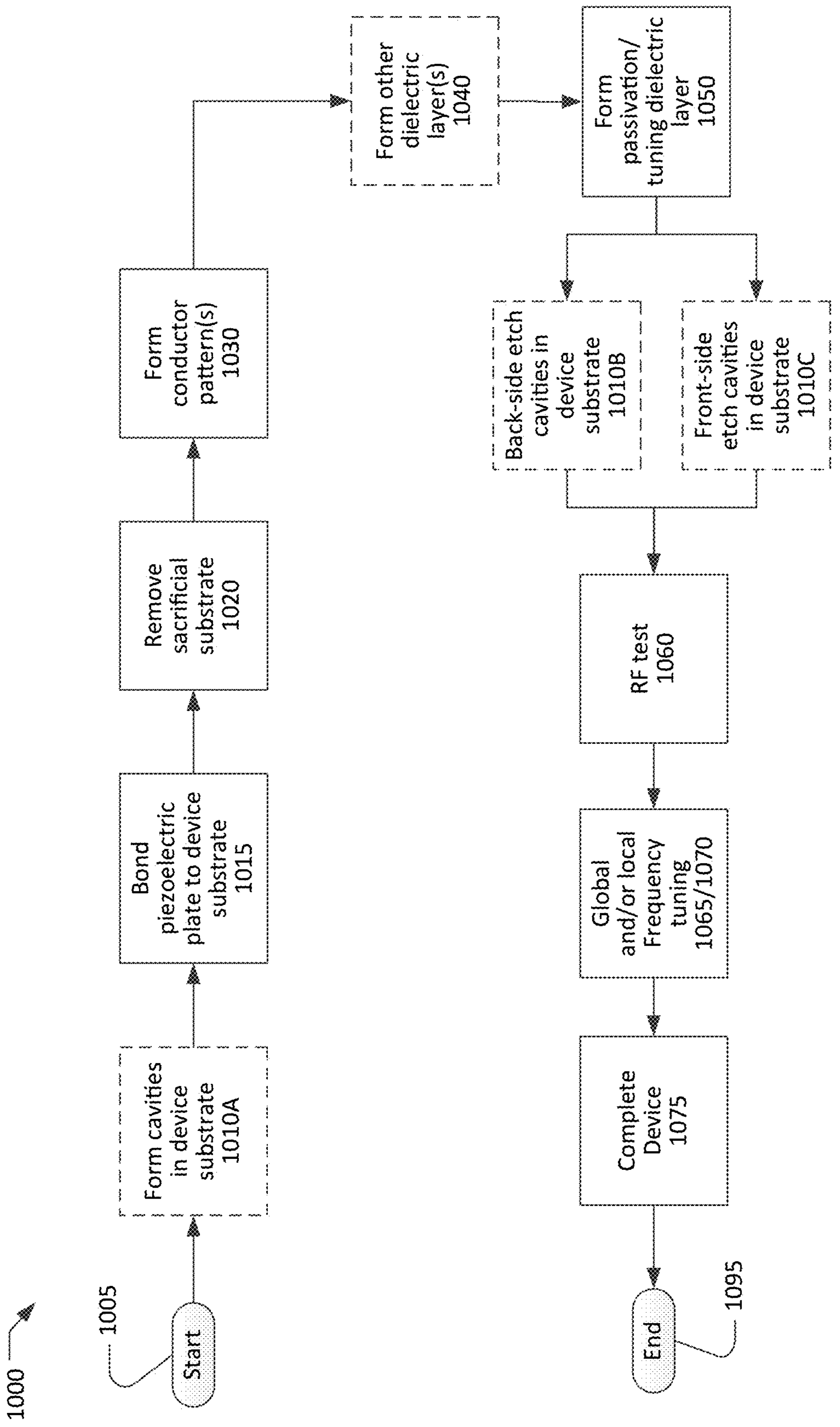
FIG. 10 illustrates a flowchart of a method of manufacturing an acoustic resonator device as described herein according to an exemplary aspect.

FIG. 10 illustrates a flowchart of a method 1000 of manufacturing a filter as described herein according to an exemplary aspect. In particular, method 1000 summarizes an exemplary manufacturing processing for fabricating a filter device incorporating XBARs that are parallel coupled to MPM capacitor structures as described herein. Specifically, the process 1000 for fabricating a filter device including multiple XBARs having parallel plate MPM capacitors as described herein. The process 1000 starts at 1005 with a device substrate and a thin layer of piezoelectric material disposed on a sacrificial substrate. The process 1000 ends at 1095 with a completed filter device. The flow chart of FIG. 10 includes only major process steps. Various conventional process steps (e.g., surface preparation, cleaning, inspection, baking, annealing, monitoring, testing, etc.) may be performed before, between, after, and during the steps shown in FIG. 10. It is noted that at 1005, a material layer (e.g., a floating metal layer for the capacitor as described above) may be deposited on the piezoelectric material before it is coupled to the sacrificial substrate.

Moreover, it is noted that while FIG. 10 generally describes a process for fabricating a single filter device, multiple filter devices may be fabricated simultaneously on a common wafer (including a piezoelectric layer bonded to a substrate). In this case, each step of the process 1000 may be performed concurrently on all of the filter devices on the wafer.

The flow chart of FIG. 10 captures three variations of the process 1000 for making an XBAR which differ in when and how cavities are formed in the device substrate. The cavities may be formed at steps 1010A, 1010B, or 1010C. Only one of these steps is performed in each of the three variations of the process 1000. It should be appreciated that these steps can be omitted if the filter device comprises only SM XBARs configurations, for example. In such an embodiment, separate steps (not shown) for forming the layers of the Bragg mirror may be incorporated into the exemplary manufacturing method.

In an exemplary aspect, the piezoelectric layer may be, for example, a lithium niobate plate or a lithium tantalate plate, either of which may be Z-cut, rotated Z-cut, Y-cut, rotated Y-cut, or rotated YX-cut. For historical reasons, a rotated Y-cut plate configuration may be commonly referred to as "Y-cut", where the "cut angle" is the angle between the y axis and the normal to the plate. The "cut angle" is equal to β+90°. For example, a plate with Euler angles [0°, 30°, 0°] is commonly referred to as "120° rotated Y-cut". In some embodiments, the piezoelectric layer's z axis may be normal to the plate surface and the y axis orthogonal to the IDT fingers. Such piezoelectric plates have Euler angles of 0, 0, 90°. Further embodiments may include a piezoelectric layer with Euler angles 0, β, 90°, where β is in the range from −15° to +5° (such as Y82 discussed in more detail below), 0°≤β≤60 (such as Y120 and/or Y128 discussed in more detail below), or any combination thereof. The piezoelectric layer may be some other material and/or some other cut. The device substrate may preferably be silicon. The device substrate may be some other material that allows formation of deep cavities by etching or other processing.

In one variation of the process 1000, one or more cavities are formed in the device substrate at 1010A, before the at least one piezoelectric layer is bonded to the substrate at 1015. A separate cavity may be formed for each resonator in a filter device. Also, the cavities can be shaped and formed such that two or more resonators can be on one diaphragm over one cavity. These resonators sharing a diaphragm are acoustically coupled on an acoustic track. The one or more cavities may be formed using conventional photolithographic and etching techniques. Typically, the cavities formed at 1010A will not penetrate through the device substrate.

At 1015, the at least one piezoelectric layer is bonded to the device substrate or indirectly to a dielectric layer as described above. The at least one piezoelectric layer and the device substrate may be bonded by a wafer bonding process. Typically, the mating surfaces of the device substrate and the piezoelectric layer are highly polished. One or more layers of intermediate materials, such as an oxide or metal, may be formed or deposited on the mating surface of one or both of the piezoelectric layer and the device substrate. One or both mating surfaces may be activated using, for example, a plasma process. The mating surfaces may then be pressed together with considerable force to establish molecular bonds between the piezoelectric layer and the device substrate or intermediate material layers.

At 1020, the sacrificial substrate may be removed. For example, the piezoelectric layer and the sacrificial substrate may be a wafer of piezoelectric material that has been ion implanted to create defects in the crystal structure along a plane that defines a boundary between what will become the piezoelectric layer and the sacrificial substrate. At 1020, the wafer may be split along the defect plane, for example by thermal shock, detaching the sacrificial substrate and leaving the piezoelectric layer bonded to the device substrate. The exposed surface of the piezoelectric layer may be polished or processed in some manner after the sacrificial substrate is detached.

A first conductor pattern, including IDTs of each XBAR and the capacitor electrodes, is formed at 1030 by depositing and patterning one or more conductor layers on the front side of the piezoelectric layer. The conductor layer may be, for example, aluminum, an aluminum alloy, copper, a copper alloy, or some other conductive metal. In some aspects, one or more layers of other materials may be disposed below (i.e., between the conductor layer and the piezoelectric layer) and/or on top of the conductor layer. For example, a thin film of titanium, chrome, or other metal may be used to improve the adhesion between the conductor layer and the piezoelectric layer. A second conductor pattern of gold, aluminum, copper or other higher conductivity metal may be formed over portions of the first conductor pattern (for example the IDT bus bars and interconnections between the IDTs).

Each conductor pattern may be formed at 1030 by depositing the conductor layer and, in some aspects, one or more other metal layers in sequence over the surface of the piezoelectric layer. The excess metal may then be removed by etching through patterned photoresist. The conductor layer can be etched, for example, by plasma etching, reactive ion etching, wet chemical etching, or other etching techniques.

Alternatively, each conductor pattern may be formed at 1030 using a lift-off process. Photoresist may be deposited over the piezoelectric layer and patterned to define the conductor pattern. It should be appreciated that the photoresist for the conductor pattern can be defined to achieve the desired chirping configurations as described above. Moreover, the conductor layer and, in some aspects, one or more other layers may be deposited in sequence over the surface of the piezoelectric layer. The photoresist may then be removed, which removes the excess material, leaving the conductor pattern. It should also be appreciated that the metal layers (e.g., the electrodes for the capacitor(s)) may be deposited on the piezoelectric layer before it is bonded to the substrate at step 1015 in an alternative exemplary aspect as would be appreciated to one skilled in the art.

At 1040, one or more dielectric layers may be formed on one or both surfaces of the piezoelectric layer and conductor patterns. These layers can be deposited and trimmed to configure the resonant frequency according to exemplary aspects.

At 1050, a passivation/tuning dielectric layer may be deposited over the piezoelectric layer and conductor patterns. The passivation/tuning dielectric layer may cover the entire surface of the filter except for pads for electrical connections to circuitry external to the filter. In some instantiations of the process 1000, the passivation/tuning dielectric layer may be formed after the cavities in the device substrate and/or the intermediate layer are etched at either 1010B or 1010C.

In a second variation of the process 1000, one or more cavities are formed in the back surface of the device substrate and/or the intermediate layer at 1010B. A separate cavity may be formed for each resonator in a filter device. Also, the cavities can be shaped and formed such that plurality of resonators can be on one diaphragm over one cavity. These resonators sharing a diaphragm are acoustically coupled on an acoustic track. The one or more cavities may be formed using an anisotropic or orientation-dependent dry or wet etch to open holes through the back side of the device substrate to the piezoelectric layer. In this case, the resulting resonator devices will have a cross-section as shown in FIG. 1A.

In a third variation of the process 1000, one or more cavities in the form of recesses in the device substrate may be formed at 1010C by etching the substrate using an etchant introduced through openings in the piezoelectric layer. A separate cavity may be formed for each resonator in a filter device. Also, the cavities can be shaped and formed such that two or more resonators can be on one diaphragm over one cavity. These resonators sharing a diaphragm are acoustically coupled on an acoustic track. The one or more cavities formed at 1010C will not penetrate through the device substrate.

Ideally, after the cavities are formed at 1010B or 1010C, most or all of the filter devices on a wafer will meet a set of performance requirements. However, normal process tolerances will result in variations in parameters such as the thicknesses of dielectric layers formed at 1040 and 1050, variations in the thickness and line widths of conductors and IDT fingers formed at 1030, and variations in the thickness of the piezoelectric layer. These variations contribute to deviations of the filter device performance from the set of performance requirements.

To improve the yield of filter devices meeting the performance requirements, frequency tuning may be performed by selectively adjusting the thickness of the passivation/tuning layer deposited over the resonators at 1050. The frequency of a filter device passband can be lowered by adding material to the passivation/tuning layer, and the frequency of the filter device passband can be increased by removing material from the passivation/tuning layer. Typically, the process 1000 is biased to produce filter devices with passbands that are initially lower than a required frequency range but can be tuned to the desired frequency range by removing material from the surface of the passivation/tuning layer.

At 1060, a probe card or other means may be used to make electrical connections with the filter to allow radio frequency (RF) tests and measurements of filter characteristics such as input-output transfer function. Typically, RF measurements are made on all, or a large portion, of the filter devices fabricated simultaneously on a common piezoelectric layer and substrate.

At 1065, global frequency tuning may be performed by removing material from the surface of the passivation/tuning layer using a selective material removal tool such as, for example, a scanning ion mill as previously described. "Global" tuning is performed with a spatial resolution equal to or larger than an individual filter device. The objective of global tuning is to move the passband of each filter device towards a desired frequency range. The test results from 1060 may be processed to generate a global contour map indicating the amount of material to be removed as a function of two-dimensional position on the wafer. The material is then removed in accordance with the contour map using the selective material removal tool.

At 1070, local frequency tuning may be performed in addition to, or instead of, the global frequency tuning performed at 1065. "Local" frequency tuning is performed with a spatial resolution smaller than an individual filter device. The test results from 1060 may be processed to generate a map indicating the amount of material to be removed at each filter device. Local frequency tuning may require the use of a mask to restrict the size of the areas from which material is removed. For example, a first mask may be used to restrict tuning to only shunt resonators, a second mask may be subsequently used to restrict tuning to only series resonators, and a third mask may be subsequently used to restrict tuning to only extracted pole resonators. This would allow independent tuning of the lower band edge and upper band edge of the filter devices.

After frequency tuning at 1065 and/or 1070, the filter device is completed at 1075. Actions that may occur at 1075 include forming bonding pads, metal traces, and/or solder bumps or other means for making connection between the device and external circuitry (if such pads were not formed at 1030); excising individual filter devices from a wafer containing multiple filter devices; other packaging steps; and additional testing. After each filter device is completed, the process ends at 1095.

Referring back to the exemplary aspects above, it is noted that the excitation of fast and slow shear thickness modes should be mitigated to prevent large acoustic activity at frequencies near filter passband.

Figure 11A:
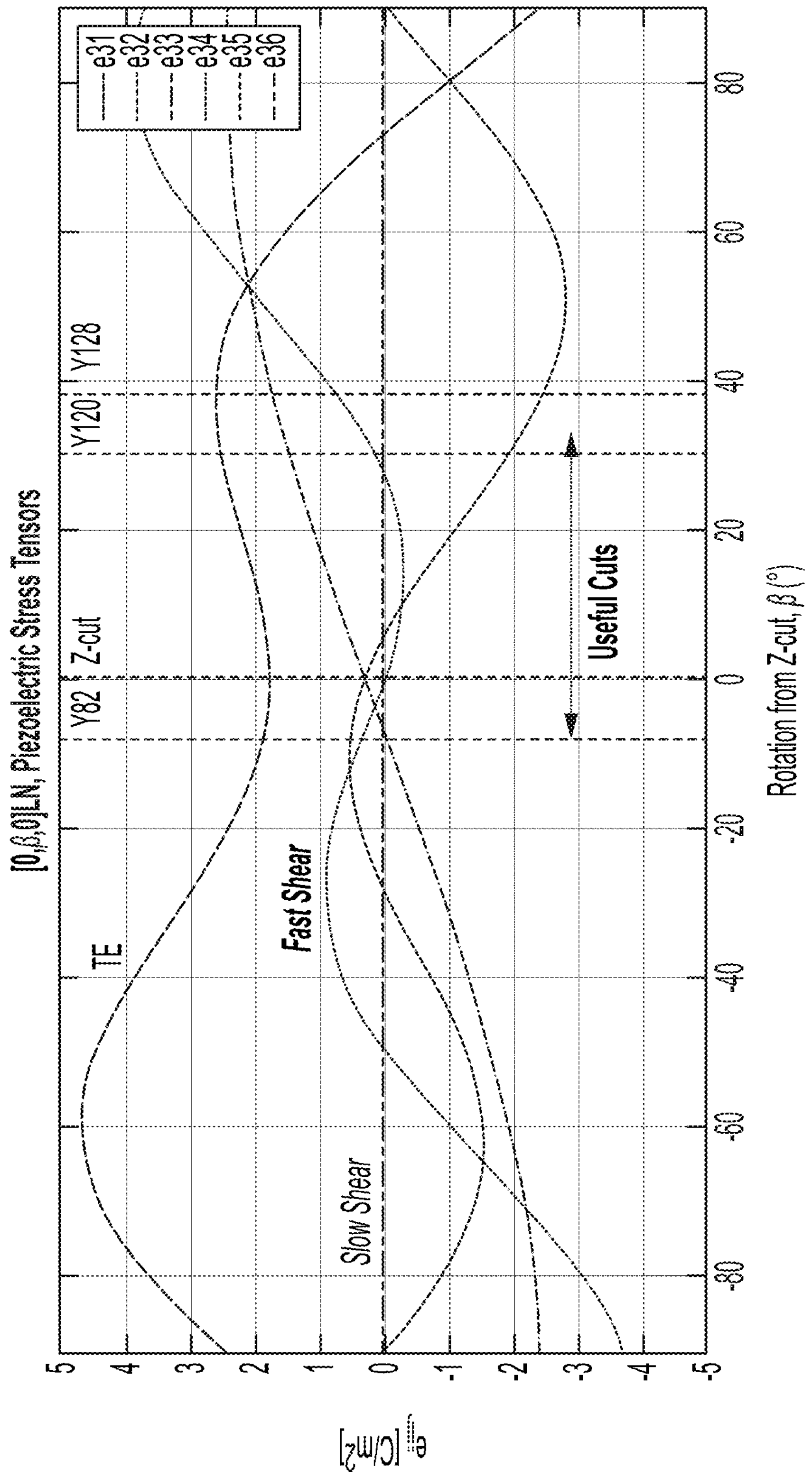
FIG. 11A is a chart of electrical field as a function of rotation from Z-cut according to an exemplary aspect.

FIG. 11A is a chart of electrical field as a function of rotation from Z-cut according to an exemplary aspect. The chart shown is simulated using finite element method (FEM) simulation techniques. As shown, based on the e34 fast shear response, a range of rotated cut angles (Y82-Y130) can be implemented for the piezoelectric layer to use the MPM capacitor structures described herein where associated piezoelectric tensors are small (i.e., as close to 0 for minimal excitation) and slow and fast shear modes are not efficiently excited by vertical electric field. In other words, unlike standard IDC capacitor structures, the electric field is held fairly constant for a large range of rotated cuts of the piezoelectric plate, includes Y120, Y128, Y82 and Z-cut.

Figure 11B:
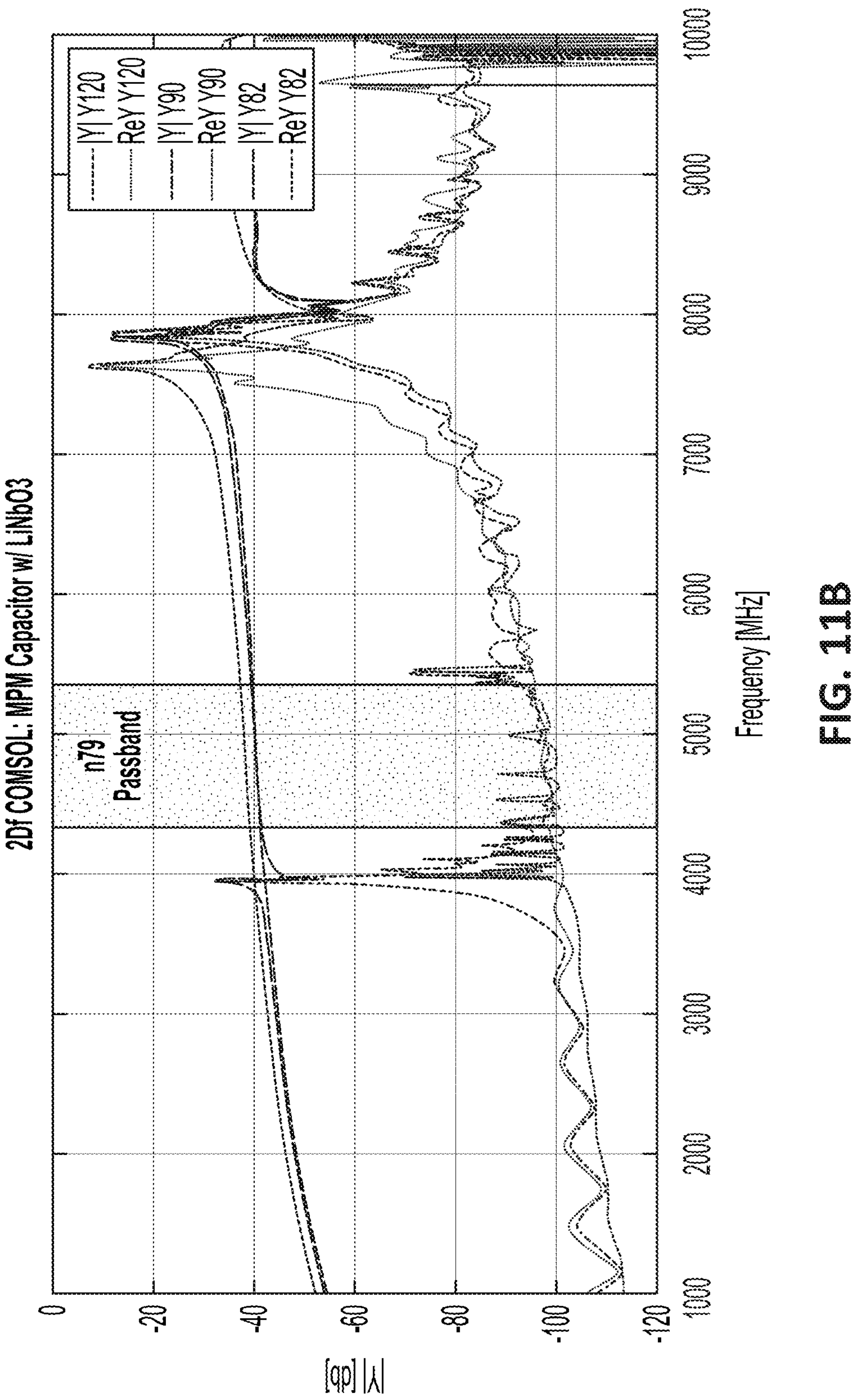
FIG. 11B is a chart of an admittance as a function of frequency of the MPM capacitor structure illustrated in FIG. 7B.

Moreover, FIG. 11B is a chart of an admittance as a function of frequency of the MPM capacitor structure illustrated in FIG. 7B. The chart shown is simulated using finite element method (FEM) simulation techniques, which illustrates that the MPM capacitor described above with respect to FIG. 7B provides for good capacitive behavior across lower frequency range, for example, the n79 passband. Moreover, while the 82Y cut exhibits that the fast shear mode becomes weakly excited, its respective resonance frequency f lies well below filter passband (i.e., the n79 passband so this effect does not affect the admittance of the filter at the passband.

Figure 12A:
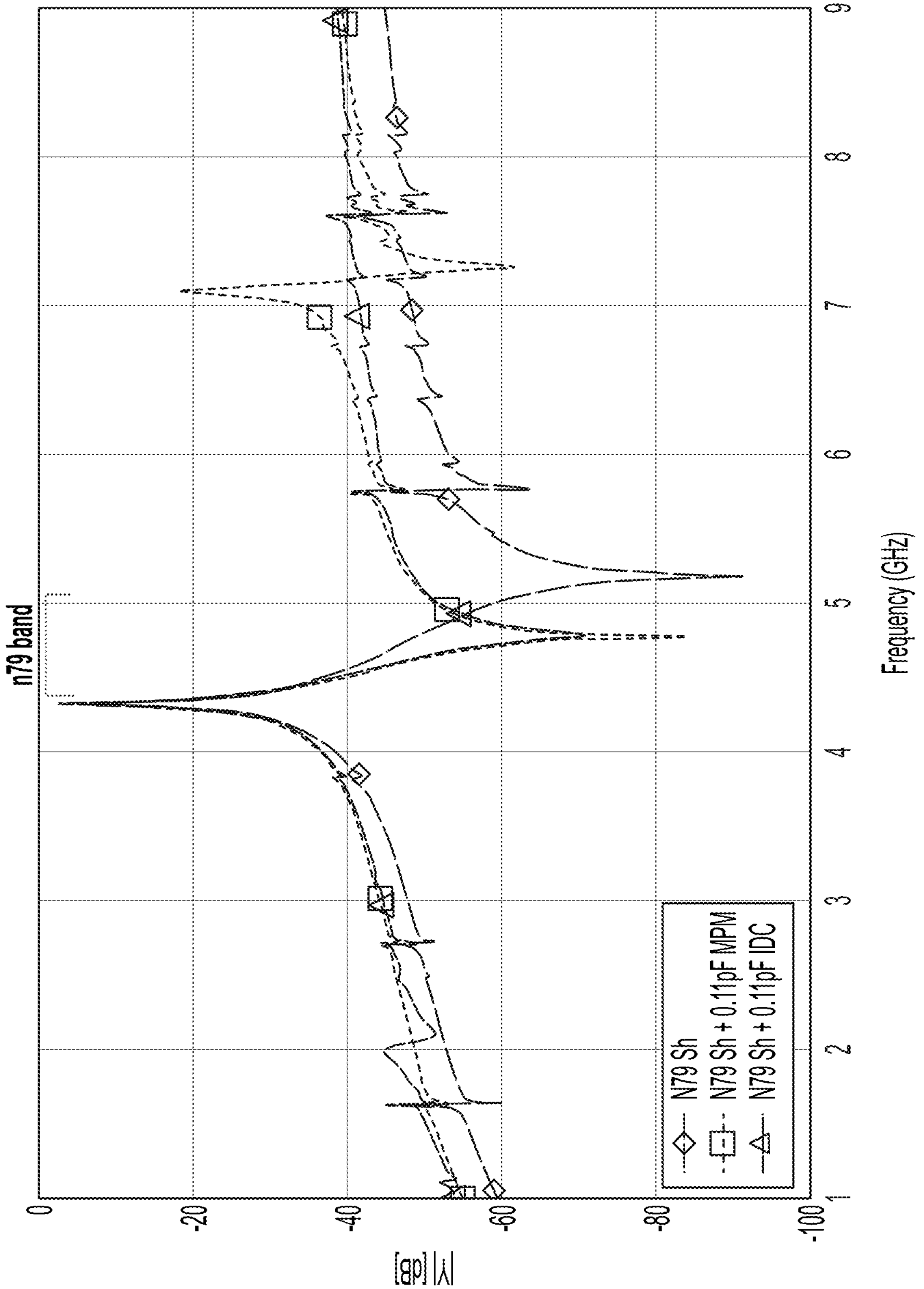
FIGS. 12A and 12B are charts of admittance as a function of frequency comparing the MPM capacitor structure of the exemplary aspect to a convention IDC capacitor.
Figure 12B:
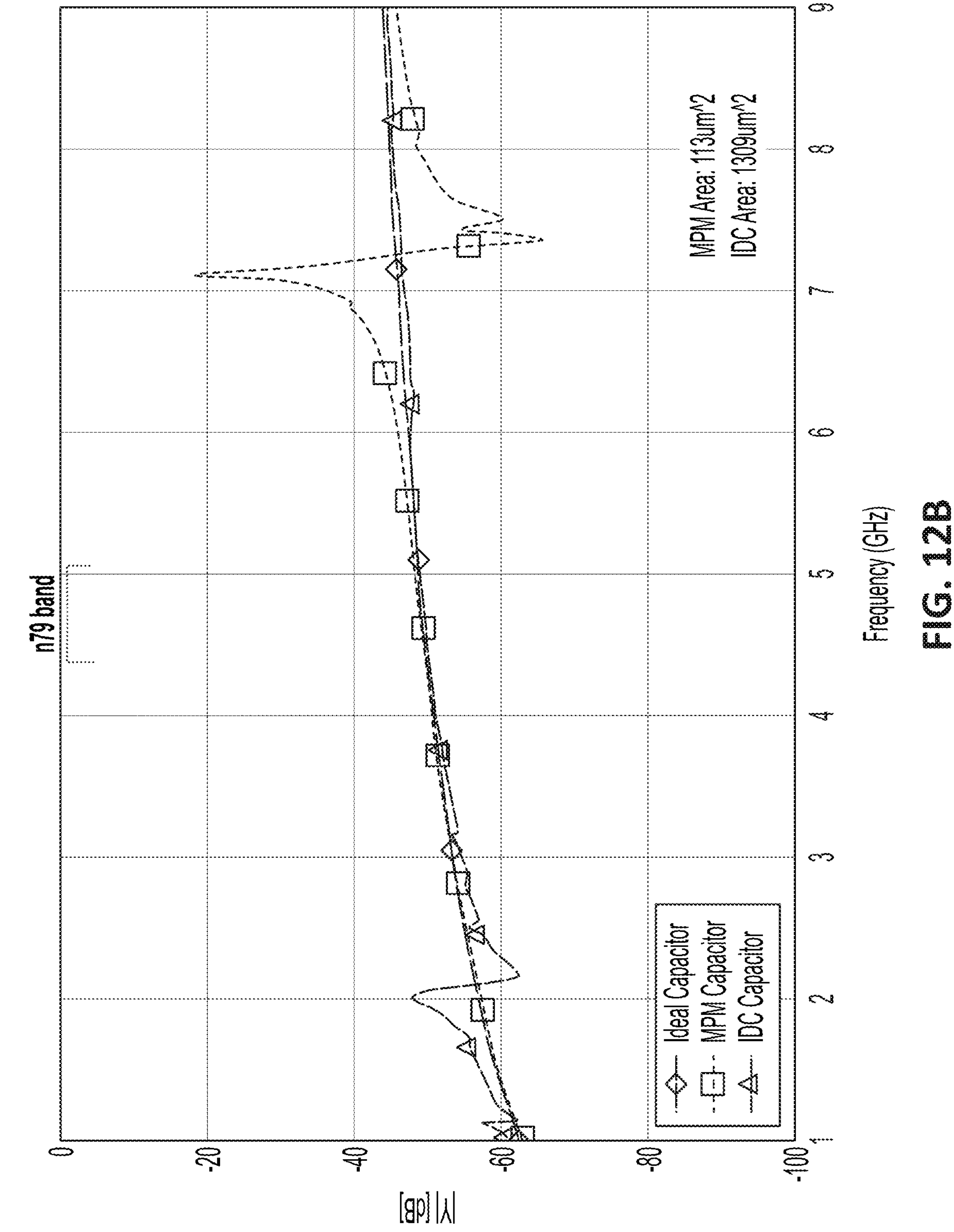

FIGS. 12A and 12B are charts of admittance as a function of frequency comparing the MPM capacitor structure of the exemplary aspect to a convention IDC capacitor. The charts were simulated using finite element method (FEM) simulation techniques. The simulation parameters for the MPM capacitor structure were a piezoelectric plate having a height of 350 nm, aluminum fingers having a mark (e.g., width) of 3.78 μm a thickness of the top electrode of 100 nm and a W of 30 μm. Moreover, the simulation parameters for a conventional IDC structure (for comparison) were a piezoelectric plate having a height of 350 nm, pitch of 1.5 μm, electrode mark (e.g., width) of 0.6 μm a thickness of the top electrode of 100 nm and a W of 45 μm. As shown in FIG. 12A, the MPM capacitor of the exemplary aspects provides for a more ideal capacitive behavior across filter passband, which means there is limited acoustic activity at these frequencies. Moreover, FIG. 12B illustrates a similar admittance at the passband between the MPM capacitor of the exemplary embodiment and a conventional IDC capacitor, but the MPM area is 113 $\mu m^2$, which is significantly reduced (approximately 10 times) compared with area of the IDC capacitor, which is 1309 $\mu m^2$. As a result, the exemplary configuration provides an additional technical advantage in which the overall size of the resonators and filters can be reduced accordingly.

Based on the foregoing disclosure, an acoustic resonator is provided that includes a substrate, a piezoelectric layer supported by the substrate and having first and second main surfaces that oppose each other; and an interdigital transducer (IDT) disposed a surface of the piezoelectric layer and that includes interleaved fingers. Moreover, the acoustic resonator includes a capacitor electrically that is coupled in parallel to the IDT and that includes at least one first electrode on the first main surface of the piezoelectric layer and a metal layer on the second main surface of the piezoelectric layer, such that the piezoelectric layer is sandwiched between the at least one first electrode and the metal layer. Advantageously, the MPM capacitor provides a much higher capacitance density (which can reduce the coupling coefficient) while also providing significant size reduction compared to conventional IDC or MIM structure.

In general, it is noted that throughout this description, the embodiments and examples shown should be considered as exemplars, rather than limitations on the apparatus and procedures disclosed or claimed. Although many of the examples presented herein involve specific combinations of method acts or system elements, it should be understood that those acts and those elements may be combined in other ways to accomplish the same objectives. With regard to flowcharts, additional and fewer steps may be taken, and the steps as shown may be combined or further refined to achieve the methods described herein. Acts, elements and features discussed only in connection with one embodiment are not intended to be excluded from a similar role in other embodiments.

As used herein, the pair of terms "top" and "bottom" can be interchanged with the pair "front" and "back". As used herein, "plurality" means two or more. As used herein, a "set" of items may include one or more of such items. As used herein, whether in the written description or the claims, the terms "comprising", "including", "carrying", "having", "containing", "involving", and the like are to be understood to be open-ended, i.e., to mean including but not limited to. Only the transitional phrases "consisting of" and "consisting essentially of", respectively, are closed or semi-closed transitional phrases with respect to claims. Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements. As used herein, "and/or" means that the listed items are alternatives, but the alternatives also include any combination of the listed items.

What is claimed:

1. An acoustic resonator comprising:

a substrate;

a piezoelectric layer coupled to the substrate by one or more dielectric layers and having first and second surfaces that oppose each other;

an interdigital transducer (IDT) on at least one of the first and second surfaces of the piezoelectric layer and including interleaved fingers that extend from opposing busbars including a first busbar and a second busbar; and a capacitor electrically coupled in parallel to the IDT and including: (i) at least one first electrode that comprises an anode connected to the first busbar, and (ii) at least one second electrode connected to the second busbar, the at least one first electrode and the at least one second electrode disposed on the first surface of the piezoelectric layer and a metal layer directly disposed on the second surface of the piezoelectric layer, such that the piezoelectric layer is sandwiched between the at least one first electrode and the metal layer, wherein the metal layer is a floating metal that at least partially overlaps both the anode and a cathode disposed on the first surface of the piezoelectric layer.

2. The acoustic resonator according to claim 1, wherein a portion of the piezoelectric layer forms a diaphragm that is over a cavity that extends at least partially in the one or more dielectric layers.

3. The acoustic resonator according to claim 2, wherein the IDT is disposed on the second surface of the piezoelectric layer that faces the cavity.

4. The acoustic resonator according to claim 2, wherein the IDT is configured such that a radio frequency signal applied to the IDT excites a bulk shear acoustic wave in the diaphragm where acoustic energy propagates along a direction substantially orthogonal to first surface of the piezoelectric layer, which is transverse to a direction of an electric field created by the interleaved fingers of the IDT.

5. The acoustic resonator according to claim 1, wherein the at least one first electrode comprises a pair of electrodes including the anode and the cathode of the capacitor.

6. The acoustic resonator according to claim 5, wherein the anode and the cathode are each elongated and extend in parallel with a plurality of the interleaved fingers of the IDT.

7. The acoustic resonator according to claim 1, wherein:

the first busbar and the second busbar each extend in a first direction from a first end to a second end thereof, the IDT comprises a first plurality of electrode fingers extending from the first busbar in a second direction towards the second busbar, with the second direction intersecting the first direction, and the IDT further comprises a second plurality of electrode fingers extending from the second busbar in the second direction towards to the first busbar, such that the first and second plurality of electrode fingers form the interleaved fingers of the IDT.

8. The acoustic resonator according to claim 7, wherein:

the anode of the capacitor extends in parallel to the first plurality of electrode fingers; and the at least one first electrode includes the cathode of the capacitor that is coupled to the second busbar and extends in parallel to the second plurality of electrode fingers.

9. The acoustic resonator according to claim 1, further comprising a Bragg mirror disposed between the piezoelectric layer and the substrate.

10. The acoustic resonator according to claim 1, wherein the piezoelectric layer comprises a pair of through holes that extend along sides of the at least one first electrode of the capacitor in a thickness direction of the piezoelectric layer.

11. The acoustic resonator according to claim 1, wherein the piezoelectric layer comprises:

a first piezoelectric layer comprising a material with a first cut having a first crystallographic orientation; and a second piezoelectric layer attached to the first piezoelectric layer and comprising a material with a second cut having a second crystallographic orientation, such that a piezoelectric tensor of the second piezoelectric layer is an opposite polarity to a piezoelectric tensor of the first piezoelectric layer.

12. A filter device comprising:

a plurality of bulk acoustic wave resonators, wherein at least one of the plurality of bulk acoustic wave resonators comprises:

a substrate;

a piezoelectric layer coupled to the substrate by one or more dielectric layers and having first and second surfaces that oppose each other;

an interdigital transducer (IDT) on at least one of the first and second surfaces of the piezoelectric layer and including interleaved fingers that extend from opposing busbars including a first busbar and a second busbar; and a capacitor electrically coupled in parallel to the IDT and including: (i) at least one first electrode that comprises an anode connected to the first busbar, and (ii) at least one second electrode connected to the second busbar, the at least one first electrode and the at least one second electrode disposed on the first surface of the piezoelectric layer and a metal layer directly disposed on the second surface of the piezoelectric layer, such that the piezoelectric layer is sandwiched between the at least one first electrode and the metal layer, wherein the metal layer is a floating metal that at least partially overlaps both the anode and a cathode disposed on the first surface of the piezoelectric layer.

13. The filter device according to claim 12, wherein the at least one first electrode comprises a pair of electrodes including the anode and the cathode of the capacitor.

14. The filter device according to claim 13, wherein the anode and the cathode are each elongated and extend in parallel with a plurality of the interleaved fingers of the IDT.

15. The filter device according to claim 12, wherein a portion of the piezoelectric layer forms a diaphragm that is over a cavity that extends at least partially in the one or more dielectric layers, and the IDT is disposed on the second surface of the piezoelectric layer that faces the cavity.

16. The filter device according to claim 15, wherein the IDT of the at least one bulk acoustic wave resonator is configured such that a radio frequency signal applied to the IDT excites a bulk shear acoustic wave in the diaphragm where acoustic energy propagates along a direction substantially orthogonal to the first and second surfaces of the piezoelectric layer, which is transverse to a direction of an electric field created by the interleaved fingers of the IDT.

17. The filter device according to claim 12, wherein for at least one bulk acoustic wave resonator:

the first busbar and the second busbar each extend in a first direction from a first end to a second end thereof, the IDT comprises a first plurality of electrode fingers extending from the first busbar in a second direction towards the second busbar, with the second direction intersecting the first direction, and the IDT further comprises a second plurality of electrode fingers extending from the second busbar in the second direction towards to the first busbar, such that the first and second plurality of electrode fingers form the interleaved fingers of the IDT.

18. The filter device according to claim 17, wherein:

the anode of the capacitor extends in parallel to the first plurality of electrode fingers; and the at least one first electrode includes the cathode of the capacitor that is coupled to the second busbar and extends in parallel to the second plurality of electrode fingers.

19. A radio frequency module comprising:

a filter device including a plurality bulk acoustic wave resonators connected in parallel; and a radio frequency circuit coupled to the filter device, the filter device and the radio frequency circuit being enclosed within a common package, wherein at least one of the plurality of bulk acoustic wave resonators of the filter device includes:

a substrate;

a piezoelectric layer coupled to the substrate by one or more dielectric layers and having first and second surfaces that oppose each other;

an interdigital transducer (IDT) on at least one of the first and second surfaces of the piezoelectric layer and including interleaved fingers that extend from opposing busbars including a first busbar and a second busbar; and a capacitor electrically coupled in parallel to the IDT and including: (i) at least one first electrode that comprises an anode connected to the first busbar, and (ii) at least one second electrode connected to the second busbar, the at least one first electrode and the at least one second electrode disposed on the first surface of the piezoelectric layer and a metal layer directly disposed on the second surface of the piezoelectric layer, such that the piezoelectric layer is sandwiched between the at least one first electrode and the metal layer, wherein the metal layer is a floating metal that at least partially overlaps both the anode and a cathode disposed on the first surface of the piezoelectric layer.

* * * * *